US012743031B1

(12) United States Patent
Sankaran

(10) Patent No.: US 12,743,031 B1
(45) Date of Patent: Sep. 22, 2026

(54) SYSTEMS AND METHODS FOR INSPECTING A PORTION OF A LITHOGRAPHY APPARATUS

(71) Applicant: ASML NETHERLANDS B.V., Veldhoven (NL)

(72) Inventor: Naveen Kumar Sankaran, Norwalk, CT (US)

(73) Assignee: ASML NETHERLANDS B.V., Veldhoven (NL)

( * ) Notice: Subject to any disclaimer, the term of this patent is extended or adjusted under 35 U.S.C. 154(b) by 142 days.

(21) Appl. No.: 18/726,405

(22) PCT Filed: Jan. 4, 2023

(86) PCT No.: PCT/EP2023/050104
§ 371 (c)(1),
(2) Date: Jul. 2, 2024

(87) PCT Pub. No.: WO2023/138916
PCT Pub. Date: Jul. 27, 2023

Related U.S. Application Data

(60) Provisional application No. 63/301,511, filed on Jan. 21, 2022.

(51) Int. Cl.
*G03F 7/00* (2006.01)
*B08B 13/00* (2006.01)

(52) U.S. Cl.
CPC ............ *G03F 7/7085* (2013.01); *G03F 7/707* (2013.01); *G03F 7/70741* (2013.01)

(58) Field of Classification Search
CPC .... G03F 7/7085; G03F 7/707; G03F 7/70741; G03F 7/70808; G03F 7/70925;
(Continued)

(56) References Cited

U.S. PATENT DOCUMENTS 6,046,792 A 4/2000 Van Der Werf et al.
6,961,116 B2 11/2005 Den Boef et al.
(Continued)

FOREIGN PATENT DOCUMENTS

DE 102019117964 7/2020
TW 201027277 7/2010
(Continued)

OTHER PUBLICATIONS

International Search Report and Written Opinion issued in corresponding PCT Patent Application No. PCT/EP2023/050104, dated Apr. 5, 2023.

(Continued)

*Primary Examiner* — Mesfin T Asfaw
(74) *Attorney, Agent, or Firm* — Pillsbury Winthrop Shaw Pittman, LLP

(57) ABSTRACT

An inspection system includes a body that is configured to be inserted into a lithography apparatus, to be engaged by a tool handler of the lithography apparatus, and to be used for inspecting a portion of the lithography apparatus. A sensor is coupled to the body, and configured to obtain an image of the portion of the lithography apparatus when the body is positioned by the tool handler. Software is configured to receive the images and facilitate semi-automated or automated inspection of the portion of the lithography apparatus based on the one or more images. The system may use less time for inspection, may produce consistent imaging resolution and clarity, may not require opening or other disassembly of the lithography apparatus, may reduce impact on a lithography apparatus micro-environment and the potential for contamination, and/or may have one or more additional or other advantages.

20 Claims, 12 Drawing Sheets

(58) Field of Classification Search
CPC ... G03F 7/70733; B08B 1/143; B08B 7/0028; B08B 13/00
See application file for complete search history.

(56) References Cited

U.S. PATENT DOCUMENTS

| | | | |
|---|---|---|---|
| 9,588,438 | B2 | 3/2017 | Hsu |
| 11,092,903 | B2 | 8/2021 | Kanehara et al. |
| 2006/0066855 | A1 | 3/2006 | Den Boef et al. |
| 2010/0045955 | A1 | 2/2010 | Vladimirsky et al. |
| 2010/0143832 | A1 | 6/2010 | Houben et al. |
| 2011/0027704 | A1 | 2/2011 | Cramer et al. |
| 2011/0043791 | A1 | 2/2011 | Smilde et al. |
| 2012/0242970 | A1 | 9/2012 | Smilde et al. |
| 2018/0321168 | A1* | 11/2018 | Sah .................... G01N 23/2251 |
| 2019/0179230 | A1 | 6/2019 | Raaymakers et al. |
| 2020/0019075 | A1* | 1/2020 | Yen .................... G03F 7/70741 |
| 2021/0341831 | A1 | 11/2021 | Brouns et al. |
| 2022/0390860 | A1 | 12/2022 | Rodak |

FOREIGN PATENT DOCUMENTS

| | | |
|---|---|---|
| TW | 201835687 | 10/2018 |
| TW | 202109209 | 3/2021 |
| TW | 202125097 | 7/2021 |
| WO | 2009/078708 | 6/2009 |
| WO | 2009/106279 | 9/2009 |

OTHER PUBLICATIONS

Anonymous, “Instrumented Reticle for In-Situ Burl Inspection of EUV Clamps,” Research Disclosure, vol. 655, No. 4, pp. 1-2 (2018).

* cited by examiner

SYSTEMS AND METHODS FOR INSPECTING A PORTION OF A LITHOGRAPHY APPARATUS

CROSS-REFERENCE TO RELATED APPLICATIONS

This application is the U.S. national phase entry of PCT Patent Application No. PCT/EP2023/050104 which was filed on Jan. 4, 2023, which claims priority of U.S. Provisional Application No. 63/301,511 which was filed on Jan. 21, 2022, and which is incorporated herein in its entirety by reference.

TECHNICAL FIELD

The description herein relates generally to systems and methods for inspecting a portion of a lithography apparatus.

BACKGROUND

A lithography (e.g., projection) apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

SUMMARY

An inspection system and associated software are described. The inspection system comprises a body that is configured to be inserted into a lithography apparatus, engaged by a tool handler of the lithography apparatus, and used for inspecting a portion of the lithography apparatus. Cameras are coupled to the body, and configured to obtain images of the portion of the lithography apparatus in response to the tool handler positioning the body. software is configured to receive the images and facilitate semi-automated or automated inspection of the portion of the lithography apparatus based on the one or more images. Compared to prior approaches, the described system requires much less time for inspection, produces consistent imaging resolution and clarity, does not require opening or other disassembly of the lithography apparatus, reduces impact on a lithography apparatus micro-environment, reduces the potential for contamination during inspection, and has other advantages.

According to an embodiment, there is provided a system for inspecting a portion of a lithography apparatus. The system comprises a body. The body is configured to be inserted into the lithography apparatus, engaged by a tool handler of the lithography apparatus, and positioned by the tool handler for inspecting the portion of the lithography apparatus. The system comprises one or more image capture devices coupled to the body. The one or more image capture devices are configured to obtain one or more images of the portion of the lithography apparatus in response to the tool handler positioning the body.

In some embodiments, the body is shaped similar to or the same as a reticle that is engaged and positioned by the tool handler. In some embodiments, the body has a rectangular shape. The tool handler comprises a reticle handler and a turret gripper. The reticle handler is configured to move the body from a load port of the lithography apparatus to the turret gripper, and the turret gripper is configured to grip the body on one of more edges and/or surfaces of the body and move the body to a position adjacent the portion of the lithography apparatus, and adjust the position of the body.

In some embodiments, the portion of the lithography apparatus comprises one or more membrane surfaces of the lithography apparatus. In some embodiments, the portion of the lithography apparatus comprises a chuck membrane associated with reticle stage reticle clamps.

In some embodiments, the one or more image capture devices comprise one or more optical cameras. In some embodiments, the system comprises one or more light sources associated with the one or more image capture devices and coupled to the body. The one or more light sources are configured to light the portion of the lithography apparatus imaged by the one or more capture devices. In some embodiments, the one or more light sources comprise one or more light emitting diodes (LEDs).

In some embodiments, the system comprises electronics coupled to the body. The electronics are configured to: receive and store the one or more images from the one or more image capture devices; and/or wirelessly communicate information to or from the one or more image capture devices.

In some embodiments, the system comprises a power source coupled to the body. The power source is configured to power the one or more image capture devices, the one or more light sources, and/or associated electronics.

In some embodiments, the body comprises one or more identification features. The one or more identification features may comprise one or more of a label, a bar code, and an alignment mark.

In some embodiments, the system comprises one or more processors. The one or more processors are configured by machine-readable instructions to: receive the one or more images from the one or more image capture devices; facilitate semi-automated or automated inspection of the portion of the lithography apparatus based on the one or more images; and communicate data to one or more external computing devices.

In some embodiments, the one or more processors are configured to facilitate semi-automated inspection. Facilitating semi-automated inspection comprises: causing display of the one or more images to a user with a user interface, and receiving entry and/or selection of control commands from the user via the user interface. The control commands comprise: instructions for moving the body and the one or more image capture devices based on a region on interest of the portion of the lithography apparatus; instructions for adjustment of a focus of the one or more image capture devices; instructions for adjustment of illumination from one or more light sources associated with the one or more image capture devices; and/or instructions for obtaining updated images using an adjusted focus and/or illumination. The one or more processors are configured to cause display of the updated images to the user with the user interface so that the user can determine presence of contamination in the region of interest based on the updated images. In some embodiments, the display of the one or more images and/or the updated images to the user comprises a live stream.

In some embodiments, the one or more processors are configured to facilitate automated inspection. Facilitating automated inspection comprises: determining a region of interest of the portion of the lithography apparatus based on the one or more images; controlling the tool handler to move the body and the one or more image capture devices based on the region on interest; adjusting of a focus of the one or more image capture devices based on the one or more images; adjusting illumination from one or more light sources associated with the one or more image capture devices based on the one or more images; causing the one or more image capture device to obtain updated images using an adjusted focus and/or illumination; and/or determining presence of contamination in the region of interest based on the updated images.

In some embodiments, the one or more processors are configured to facilitate the automated inspection based on a trained machine learning algorithm. The trained machine learning algorithm is configured to receive the one or more images as input, and output corresponding control commands. The corresponding control commands are related to determining the region of interest, controlling the tool handler to move the body and the one or more image capture devices, adjusting the focus, adjusting the illumination, causing the one or more image capture device to obtain the updated images, and/or determining the presence of contamination.

In some embodiments, the trained machine learning algorithm is trained based on previously obtained images of the portion of the lithography apparatus with and without contamination. The previously obtained images are labelled with a region of interest, a body and/or imaging device location relative to the region of interest, an imaging device focus, an illumination, and/or an indication of whether contamination is present. Lithography apparatus performance is related to contamination identified in an image, and a correlation of lithography apparatus performance data and image inspection data is used to configure the machine learning algorithm.

In some embodiments, the trained machine learning algorithm comprises a neural network having an input layer, an output layer, and one or more hidden layers.

In some embodiments, the lithography apparatus is configured for deep ultra violet (DUV) radiation or extreme ultra violet (EUV) radiation.

According to another embodiment, there is provided a computer program product comprising a non-transitory computer readable medium having instructions recorded thereon. The instructions, when executed by one or more processors of a computer, cause operations comprising: receiving one or more images from one or more image capture devices included in an inspection system for inspecting a portion of a lithography apparatus. The system comprises a body configured to be inserted into the lithography apparatus, engaged by a tool handler of the lithography apparatus, and positioned by the tool handler for inspecting the portion of the lithography apparatus. The system comprises the one or more image capture devices. The one or more image capture devices are coupled to the body. The one or more image capture devices are configured to obtain one or more images of the portion of the lithography apparatus in response to the tool handler positioning the body. The operations further comprise facilitating inspection of the portion of the lithography apparatus based on the one or more images. In some embodiments, the one or more processors are configured to facilitate automated or semi-automated inspection.

According to another embodiment, there is provided a method for inspecting a portion of a lithography apparatus. The method comprises receiving a body inserted into the lithography apparatus. The body is configured to be engaged by a tool handler of the lithography apparatus, and positioned by the tool handler for inspecting the portion of the lithography apparatus. The method comprises obtaining one or more images of the portion of the lithography apparatus with one or more image capture devices coupled to the body. The one or more image capture devices is configured to obtain one or more images of the portion of the lithography apparatus in response to the tool handler positioning the body. In some embodiments, the method comprises receiving, with one or more processors, the one or more images from the one or more image capture devices; facilitating, with the one or more processors, semi-automated or automated inspection of the portion of the lithography apparatus based on the one or more images; and communicating, with the one or more processors, data to one or more external computing devices.

BRIEF DESCRIPTION OF THE DRAWINGS

The accompanying drawings, which are incorporated in and constitute a part of the specification, illustrate one or more embodiments and, together with the description, explain these embodiments. Embodiments of the invention will now be described, by way of example only, with reference to the accompanying schematic drawings in which corresponding reference symbols indicate corresponding parts, and in which.

DETAILED DESCRIPTION

Figures 1, 2:
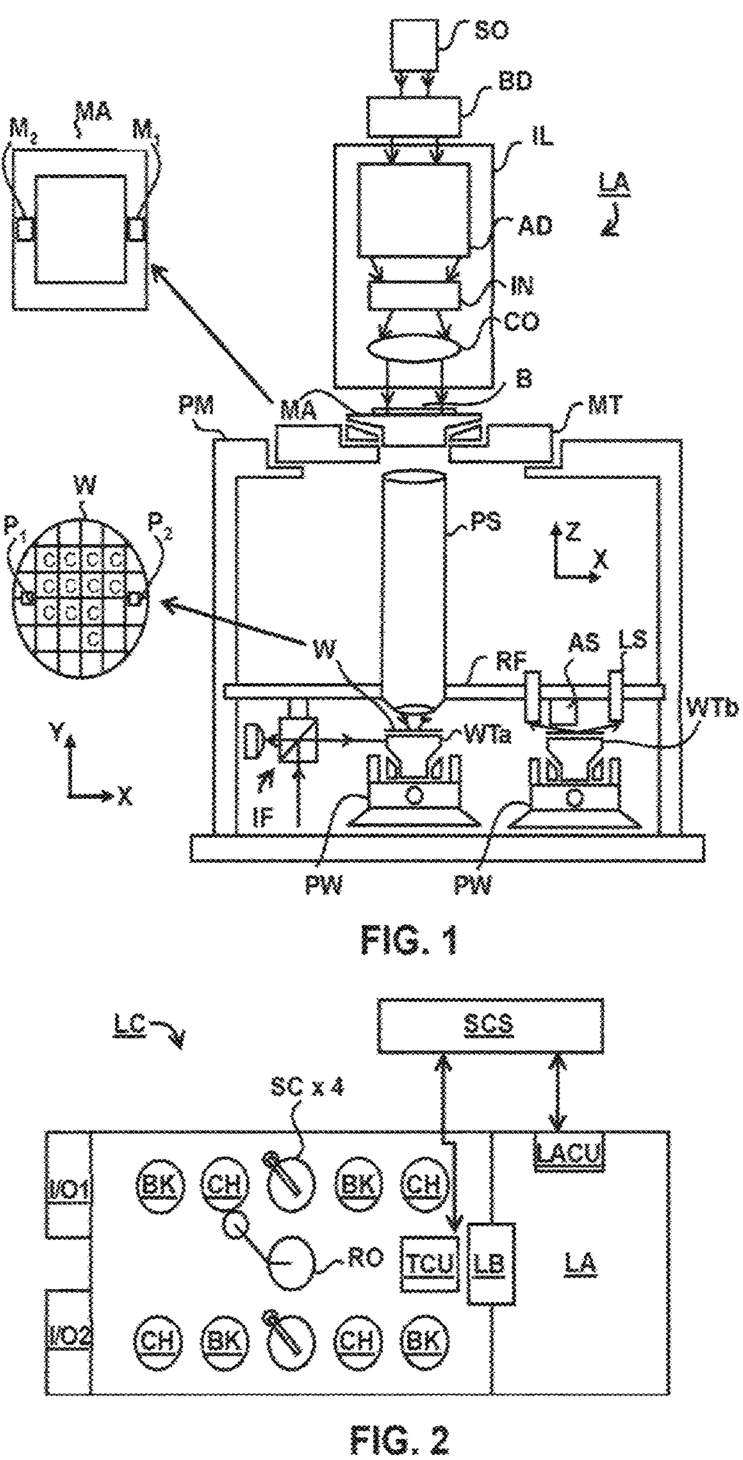
FIG. 1 schematically depicts a lithography apparatus, according to an embodiment.
FIG. 2 schematically depicts an embodiment of a lithographic cell or cluster, according to an embodiment.

In general, a mask or reticle may be a transparent block of material that is covered with a pattern defined by a different, opaque material. Various masks are fed into a lithographic apparatus and used to form layers of a semiconductor device. The pattern defined on a given mask or reticle corresponds to features produced in one or more layers of the semiconductor device. Often, a plurality of masks or reticles are automatically fed into a lithographic apparatus during manufacturing and used to form corresponding layers of a semiconductor device. Clamps (e.g., reticle stage reticle clamps) in the lithographic apparatus are used to secure the masks or reticles during processing. Membranes associated with these clamps need periodic inspection. Inspection may be required if, for example, a membrane is suspected of being contaminated or broken. Inspection may also be required as part of normal scheduled maintenance. Typically, inspection requires stopping the lithographic apparatus and the manufacturing process. A temporary structure with a camera is attached to the lithography apparatus, and the inspection is performed manually by a technician. This inspection typically requires several hours to complete, exposes the environment inside the lithographic apparatus to ambient conditions, may introduce contaminants into the system, and/or have other disadvantages.

In contrast, the present systems and methods provide an inspection system configured to be used to inspect the membranes associated with reticle stage clamps of a lithographic apparatus in-situ, while the lithographic apparatus continues to operate. The clamps comprise several components that are configured to support and provide a connection to a chuck body. The membranes are the portions of the clamps that are in contact with a reticle. The inspection system is configured to be automatically inserted into, and handled by, the lithographic apparatus just as any other mask or reticle is automatically inserted into, and handled by, the lithographic apparatus. Inspecting the lithographic apparatus with the present inspection system saves hours of downtime associated with prior inspection methods. In addition, the present system is configured to avoid exposing an environment inside the lithographic apparatus to ambient conditions, and avoid contaminating the membranes and/or other parts of the lithographic apparatus (e.g., a reticle handler robot gripper) with contamination from the manual membrane inspection tool or contamination introduced by the user performing the manual inspection/maintenance.

Although specific reference may be made in this text to the manufacture of integrated circuits (ICs), it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms “reticle”, “wafer” or “die” in this text should be considered as interchangeable with the more general terms “mask”, “substrate” and “target portion”, respectively. In addition, any use of the terms “reticle” or “mask” herein may be considered synonymous with the more general term “patterning device.”

As an introduction, prior to transferring a pattern from a patterning device such as a mask to a substrate, the substrate may undergo various procedures, such as priming, resist coating and a soft bake. After exposure, the substrate may be subjected to other procedures (“post-exposure procedures”), such as a post-exposure bake (PEB), development, a hard bake and measurement and/or other inspection of the transferred pattern. This array of procedures is used as a basis to make an individual layer of a device, e.g., an IC. The substrate may then undergo various processes such as etching, ion-implantation (doping), metallization, oxidation, chemical mechanical polishing, etc., all intended to finish an individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical mechanical polishing, ion implantation, and/or other processes. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc. One or more metrology processes are typically involved in the patterning process.

Lithography is a step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as “Moore’s law”. At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula CD=k1×λ/NA, where λ is the wavelength of radiation employed (currently in most cases 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping, or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

FIG. 1 schematically depicts an embodiment of a lithographic apparatus LA that may be included in and/or associated with the present systems and/or methods. The apparatus comprises: an illumination system (illuminator) IL configured to condition a radiation beam B (e.g. UV radiation, DUV radiation, or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT (e.g., WTa, WTb or both) configured to hold a substrate (e.g. a resist-coated wafer) W and coupled to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame (RF). As depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AD configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AD. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode, the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic, or other types of optical components, or any combination thereof, for directing, shaping, or controlling radiation. Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" used herein should be broadly interpreted as referring to any device that can be used to impart a pattern in a target portion of the substrate. In an embodiment, a patterning device is any device that can be used to impart a radiation beam with a pattern in its cross-section to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in a target portion of the device, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic, and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WTa or WTb) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism configured to adjust one or more of the optical elements to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z, or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such “multiple stage” machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term “immersion” as used herein does not mean that a structure, such as a substrate, must be submerged in liquid, but rather only means that liquid is located between the projection system and the substrate during exposure.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder, 2-D encoder, or capacitive sensor), the substrate table WT can be moved accurately, e.g. to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus may be used in at least one of the following modes: 1. In step mode, the support structure MT and the substrate table WT are kept essentially stationary, while a pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure. 2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. 3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above. Combinations and/or variations on the above-described modes of use or entirely different modes of use may also be employed.

A substrate may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already includes multiple processed layers.

The terms "radiation" and "beam" used herein encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, critical dimension (CD), edge placement, overlapping, resist top loss, resist undercut and/or bridging. The process window of the patterns on a patterning device or an area thereof may be obtained by merging (e.g., overlapping) process windows of each individual pattern. The boundary of the process window of a group of patterns comprises boundaries of process windows of some of the individual patterns. In other words, these individual patterns limit the process window of the group of patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that other patterns are not defective.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. For example, contamination on reticle clamp membranes (e.g., as described herein) may adversely affect overlay because clamping a reticle over such contamination will distort the reticle. Accordingly, a manufacturing facility in which lithocell LC is located also typically includes a metrology system that measures some or all of the substrates W (FIG. 1) that have been processed in the lithocell or other objects in the lithocell. The metrology system may be part of the lithocell LC, for example it may be part of the lithographic apparatus LA (such as alignment sensor AS (FIG. 1)).

The one or more measured parameters may include, for example, alignment, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching, after-etching, after deposition, and/or at other times.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and $+1^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target.

Thus, in a device fabrication process (e.g., a patterning process, a lithography process, etc.), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as the ASML YieldStar metrology tool, the ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which meet specifications.

Within a metrology system, a metrology apparatus is used to determine one or more properties of the substrate, and in particular, how one or more properties of different substrates vary, or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars, or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

As lithography nodes keep shrinking, more and more complicated wafer designs may be implemented. Various tools and/or techniques may be used by designers to ensure complex designs are accurately transferred to physical wafers. These tools and techniques may include mask optimization, source mask optimization (SMO), OPC, design for control, and/or other tools and/or techniques. For example, a source mask optimization process is described in U.S. Pat. No. 9,588,438 titled "Optimization Flows of Source, Mask and Projection Optics", which is incorporated in its entirety by reference.

The present systems, and/or methods may be used as stand-alone tools and/or techniques, and/or or used in conjunction with other semiconductor manufacturing processes, to enhance the accurate transfer of complex designs to physical wafers.

As described above, the present system comprises an inspection system configured to be used to inspect a portion of a lithographic apparatus in-situ, while the lithographic apparatus continues to operate. For example, the inspection system may simply replace a typical reticle inserted into the lithographic apparatus. The lithographic apparatus may move the inspection system through typical movements and/or positions of the replaced reticle such that the lithographic apparatus does not require special adjustments for the inspection system during operation. In some embodiments, the portion of the lithography apparatus to be inspected comprises membranes associated with reticle stage reticle clamps, and/or other portions of the lithographic apparatus. The inspection system is configured to be inserted into, and automatically handled (e.g., moved, rotated, etc.) by, the lithographic apparatus just as any other mask or reticle is inserted into, and automatically handled by, the lithographic apparatus.

Inspecting the lithographic apparatus with the present inspection system saves hours of downtime associated with prior inspection methods. In addition, the present system is configured to avoid exposing an environment inside the lithographic apparatus to ambient conditions, contaminating other parts of the lithographic apparatus (e.g., a reticle handler robot gripper) with material removed from the membranes, and/or have other advantages.

Figure 3A:
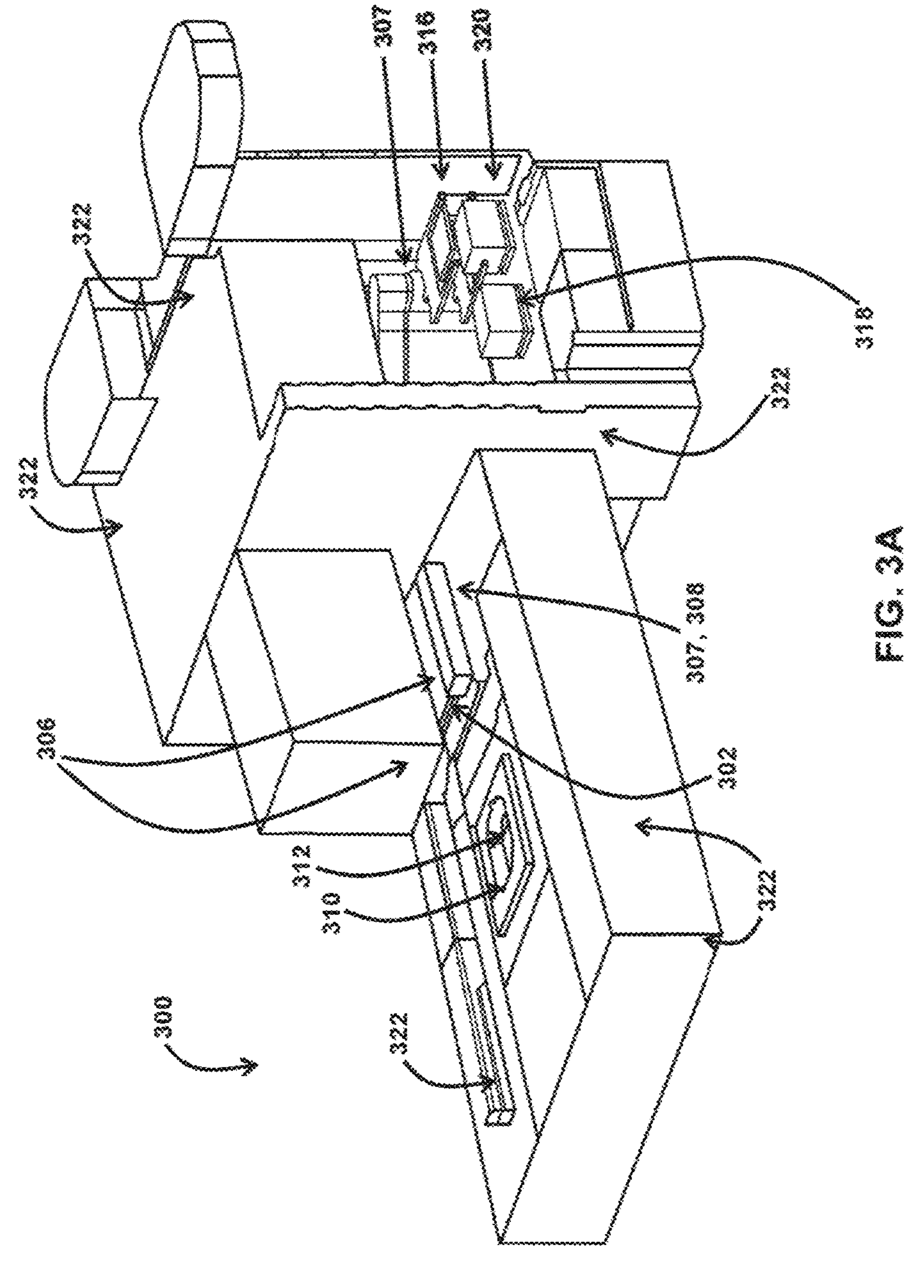
FIG. 3A illustrates a lithographic apparatus including a reticle handler turret gripper, reticle stage reticle clamps, and/or other components, according to an embodiment.
Figure 3B:
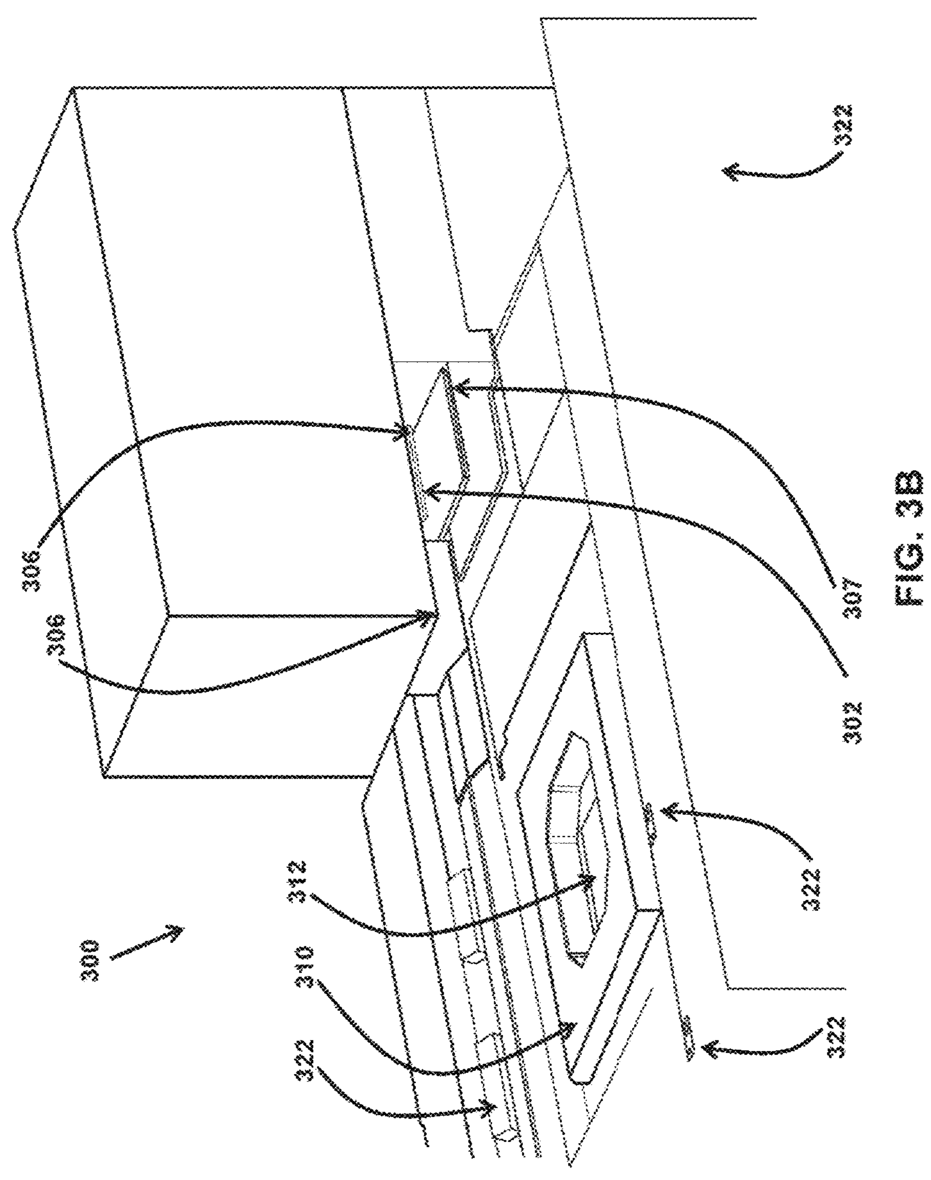
FIG. 3B is an enlarged view of a portion of the lithographic apparatus shown in FIG. 3A, according to an embodiment.

In some embodiments, the present system includes the inspection system, one or more processors included in a computing system, and/or other components. By way of a non-limiting example, FIGS. 3A and 3B illustrate (a portion of) a lithographic apparatus 300 (e.g., similar to an or the same as the lithographic apparatus shown in FIG. 1). FIG. 3A illustrates inspection system 302 and various components of lithographic apparatus 300 including a tool handler 306, 307, 308, reticle stage 310, reticle clamps 312 (only one side is visible in FIG. 3A), and/or other components. In some embodiments, lithographic apparatus 300 is configured for deep ultraviolet (DUV) lithography. In some embodiments, a similar apparatus may be configured for extreme ultraviolet (EUV) lithography. In some embodiments, inspection system 302 comprises a body, one or more image capture devices, one or more light sources, electronics, a power source, one or more identification features, the one or more processors and/or computing system described above, and/or other components. The components are described in turn, below.

In some embodiments, tool handler 306, 307, 308 comprises a reticle handler turret gripper 306, a reticle handler robot gripper 307 (having associated clamps 308, etc. for gripping a reticle), and/or other components. Reticle handler robot gripper 307 may, for example, move a reticle from a pod 320 (e.g., after a user places a reticle in pod 320). Reticle handler turret gripper 306 may, for example, move a reticle from reticle handler robot gripper 307 to reticle clamps 312.

Lithographic apparatus 300 may include various other mechanical components 322 (translation mechanisms, elevation mechanisms, rotational mechanisms, motors, power generation and transmission components, structural components, etc.) configured to facilitate movement and control of inspection system 302 through lithographic apparatus 300.

Inspection system 302 is configured to be used to inspect membranes associated with clamps 312 (e.g., membranes of the clamps that make contact with the underside of the reticle) of lithographic apparatus 300 in-situ, while lithographic apparatus 300 continues to operate. Inspection system 302 is configured to be inserted into, and automatically handled by, lithographic apparatus 300 just as any other mask or reticle 316 is automatically inserted into, and handled by, lithographic apparatus 300. For example, inspection system 302 is sized and shaped to be inserted into lithographic apparatus 300 at a typical insertion point 318 using a typical insertion method, just as any other reticle 316 would be inserted into apparatus 300.

FIG. 3B is an enlarged view of a portion of apparatus 300. FIG. 3B shows inspection system 302, reticle handler turret gripper 306, reticle stage 310, reticle stage reticle clamps 312 (only one side is visible in FIG. 3B), mechanical components 322, reticle handler robot gripper 307, and/or other components. As shown in FIG. 3B, reticle handler turret gripper 306 is configured to move inspection system 302 from reticle handler robot gripper 307 to reticle clamps 312 so inspection system 302 can be used to inspect the membranes associated with clamps 312 in situ. Moving inspection system 302 may comprise moving inspection system toward or away from the membranes and clamps 312 in horizontal, vertical, and/or other directions. Reticle handler turret gripper 306 and/or reticle handler robot gripper 307 may include various motors, translators, rotational components, clamps, clips, power sources, power transmission components, vacuum mechanisms, and/or other components that facilitate the movement of inspection system 302.

Figure 4:
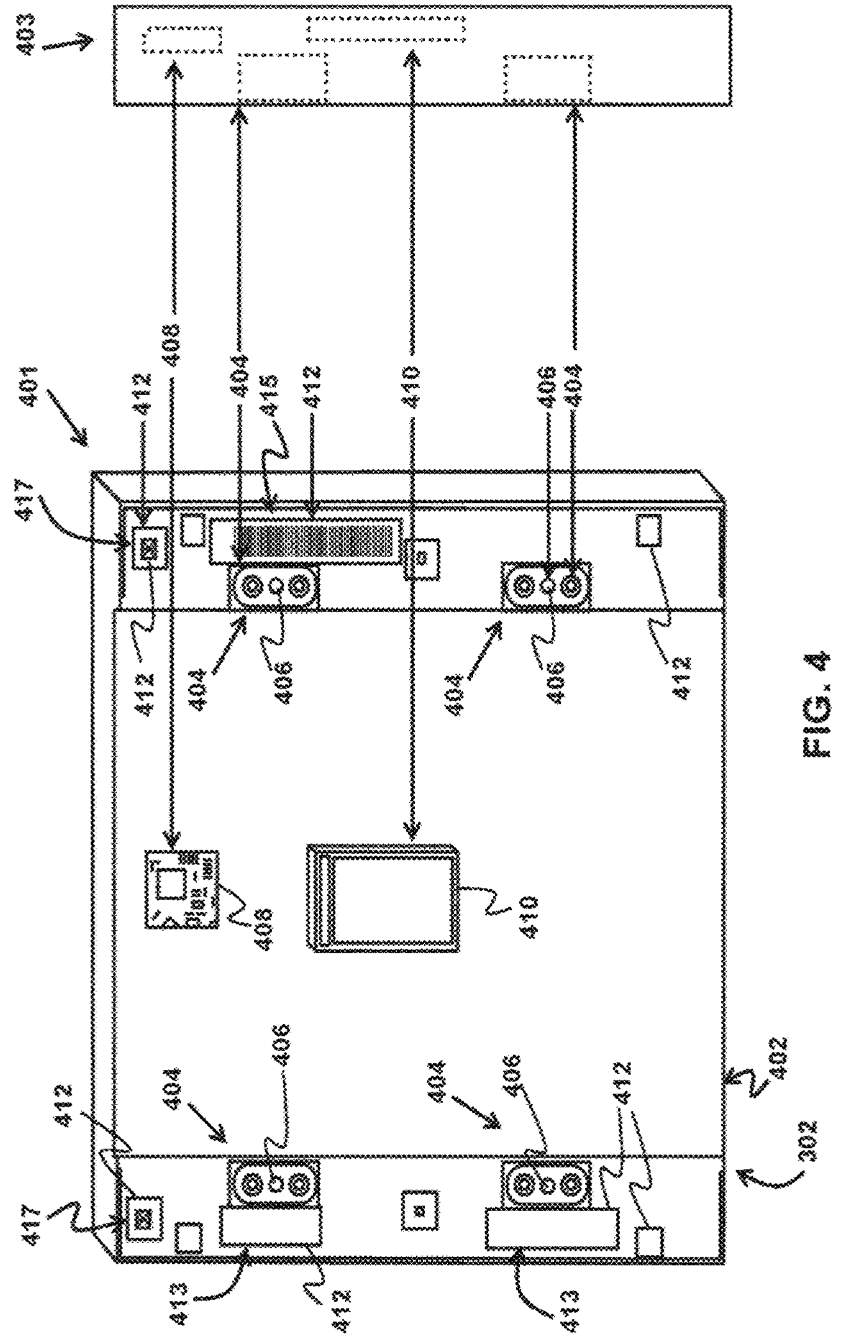
FIG. 4 illustrates an inspection system, according to an embodiment.

FIG. 4 illustrates an example embodiment of inspection system 302 (FIGS. 3A and 3B). FIG. 4 illustrates a bottom view 401 and a side view 403 of inspection system 302. As shown in FIG. 4, inspection system 302 includes a body 402, one or more image capture devices 404, one or more light sources 406, electronics 408, a power source 410, one or more identification features 412, and/or other components. The various components of inspection system 302 shown in FIG. 4 may be coupled in any arrangement and using any coupling components that allow inspection system 302 to function as described herein. For example, the various components of inspection system 302 may be coupled together with clamps, clips, adhesive, screws, nuts, collars, and/or other coupling mechanisms. In some embodiments, inspection system 302 includes and/or is configured to communicate with one or more processors and/or a computing system, as described below (see FIG. 11).

Body 402 is configured to be inserted into the lithography apparatus, engaged by the tool handler (described above) of the lithography apparatus, and be positioned by the tool handler for inspecting a portion of the lithography apparatus. In some embodiments, the portion of the lithography apparatus comprises a chuck membrane associated with reticle stage reticle clamps (described above). Body 402 has a rectangular shape. As described above, tool handler comprises a reticle handler and a turret gripper (see discussion related to FIGS. 3A and 3B above). The reticle handler is configured to move body 402 from a load port of the lithography apparatus to the turret gripper, and the turret gripper is configured to grip body 402 on one of more edges and/or other surfaces of body 402 and move body 402 to a position adjacent the portion of the lithography apparatus, and adjust the position of body 402.

Body 402 is shaped similar to or the same as a reticle that is typically engaged and positioned by the tool handler. For simplicity and to facilitate the discussion below, FIG. 4 illustrates body 402 as a single block of material shaped as a rectangular prism, formed from an opaque material. This is not intended to be limiting. In some embodiments, one or more portions of body 402 may be formed from transparent or nearly transparent material such as ultra-low thermal-expansion quartz (SFS), a transparent material such as glass, an opaque material such as metal, a polymer, a ceramic, and/or other materials. Fabrication of body 402 can utilize any number of materials, provided the external dimension and mass conform to the "SEMI standard P1 for Hard Surface Photomask Substrates," for example.

One or more image capture devices 404 are coupled to body 402. Image capture devices 404 are configured to obtain one or more images of the portion (e.g., a membrane) of the lithography apparatus (e.g., lithography apparatus 300 shown in FIGS. 3A and 3B) when body 402 is positioned by the tool handler. One or more image capture devices 404 are configured to obtain the one or more images with a specific focus, zoom level, and/or other characteristics. In some embodiments, the one or more image capture devices comprise one or more optical cameras. The one or more cameras may have a compact size, with high magnification capabilities, high resolution, and/or other characteristics, for example.

Four image capture devices 404 are shown in FIG. 4. This is not intended to be limiting. The number, location, and/or orientations of image capture devices 404 may vary based on resolution requirements, a field of view of an individual image capture device 404, and/or other factors. In some embodiments, image capture devices 404 may be coupled to body 402 at different locations (and/or in different orientations) such that image capture devices 404 are configured to obtain different but overlapping images for different portions of a membrane of the lithography apparatus (e.g., lithography apparatus 300 shown in FIGS. 3A and 3B). For example, individual image capture devices 404 may be located at different positions on body 402 relative to each other, one or more light sources 406, and/or other components. The different positions may cause individual image capture devices 404 to obtain images for different portions of a membrane surface (or multiple membranes) of the lithography apparatus.

One or more light sources 406 are configured to light the portion of the lithography apparatus (e.g., a membrane) imaged by image capture devices 404. Individual light sources 406 may be associated with one or more individual image capture devices 404. For example, as shown in FIG. 4, one light source 406 and one image capture device 404 are located proximate each other on body 402. Light sources 406 are coupled to body 402 at locations proximate to image capture devices 404 so that individual light sources 406 provide light or illuminate an area imaged by a corresponding image capture device 404. However, other configurations are contemplated. In some embodiments, light sources 406 may be configured to provide illumination such that the one or more identification features 412 are visible before, during, and/or after inspection.

In some embodiments, light sources 406 each comprise a light emitting diode (LED). In some embodiments, light sources 406 comprise an illumination guide and/or other components configured to guide illumination from the LED toward a membrane of the lithography apparatus. For example, an illumination guide may include one or more cavities located proximate to light sources 406. Light sources 406 may also include various channels, reflective surfaces, etc. configured to guide light for imaging. In some embodiments, instead of and/or in addition to an LED, light sources 406 may comprise one or more mirrors and/or other reflective surfaces configured to guide ambient light from the ambient atmosphere toward the one or more membranes being imaged. In some embodiments, illumination can also be provided by 'glow in the dark' paint, or other similar products such as a vial of tritium and/or other materials.

Body 402 includes an electrical energy power source 410 such as a battery and/or other power sources for image capture devices 404 and/or light sources 406, wiring coupling power source 410 to other components of system 302, and/or other components configured to allow inspection system 302 to function as described herein. Power source 410 is shown at or near a center of body 402 in FIG. 4, but this is not intended to be limiting. Power source 410 may be arranged in any location that allows inspection system 302 to function as described herein.

Electronics 408 are coupled to body 402, image capture devices 404, light sources 406, power source 410, and/or other components. In some embodiments, electronics 408 are configured to receive and store the one or more images from one or more image capture devices 404. For example, electronics 408 may comprise electronic storage media that electronically stores information. The electronic storage media may comprise one or both of system storage that is provided integrally (i.e., substantially non-removable) with inspection system 302 and/or removable storage that is removably connectable to inspection system 302 via, for example, a port (e.g., a USB port, a firewire port, etc.) or a drive (e.g., a disk drive, etc.). Electronics 408 may comprise one or more of optically readable storage media (e.g., optical disks, etc.), magnetically readable storage media (e.g., magnetic tape, magnetic hard drive, floppy drive, etc.), electrical charge-based storage media (e.g., EPROM, RAM, etc.), solid-state storage media (e.g., flash drive, etc.), and/or other electronically readable storage media. Electronics 408 may store information received from image capture devices 404 such as the one or more images, and/or other information that enables inspection system 302 (FIG. 3A, 3B) to function properly.

In some embodiments, electronics 408 include a transmitter and/or other components configured to wirelessly communicate information to or from one or more image capture devices 404. The information may be and/or include the one or more images, for example, and/or other information. This communication may occur with or without first storing the one or more images as described above. This communication may be to or from an external computing system (e.g., including the one or more processors described herein and as described related to FIG. 11 below), and/or other devices. In some embodiments, the communication may be in real time or in near real time. In some embodiments, this may comprise a live stream, for example. In some embodiments, electronics 408 may be configured to communicate some information in real time or near real time, but store other information in electronic storage for later transfer to the external computing system.

In some embodiments, body 402 comprises one or more identification features 412. The one or more identification features 412 comprise one or more of a label 413, a bar code 415, an alignment mark 417, and/or other identification features. Body 402 configured such that identification features 412 are visible to user and/or the lithography apparatus (e.g., lithography apparatus 300 shown in FIG. 3A, 3B) so that body 402 can be properly identified, loaded into and received by lithography apparatus 300, and positioned by lithography apparatus 300 for inspection.

Figure 11:
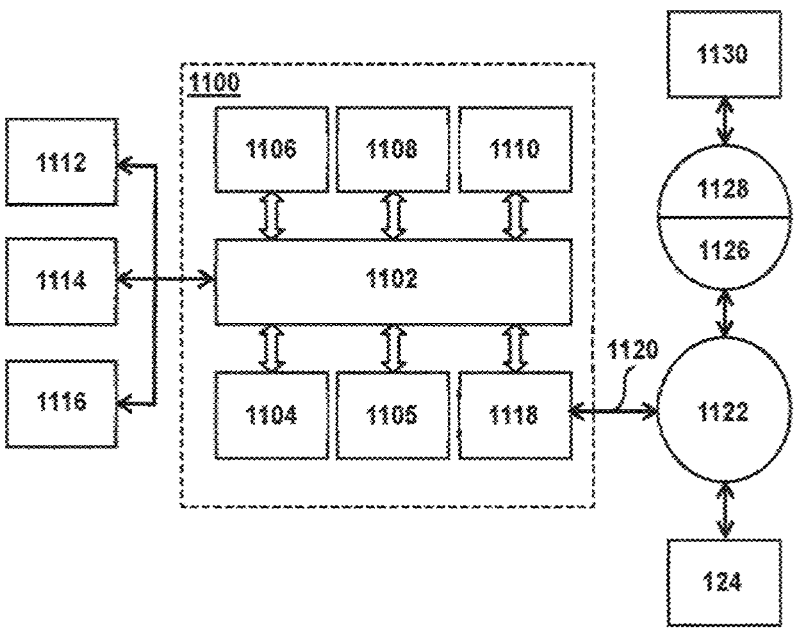
FIG. 11 is a block diagram of an example computer system, according to an embodiment.

In some embodiments, inspection system 302 includes and/or is configured to communicate with one or more processors and/or a computing system (see processor(s) 1104 and 1105 shown in FIG. 11). In some embodiments, the one or more processors and/or the computing system may be included in lithography apparatus 300 (FIG. 3A, 3B), for example, and/or control software running on lithography apparatus 300. The one or more processors are configured by machine-readable instructions. The one or more processors are configured to receive the one or more images from the one or more image capture devices; communicate (in real time or near real time) data between electronics 408 and one or more external computing devices (e.g., which may include the one or more processors); facilitate semi-automated or automated inspection of the portion of the lithography apparatus based on the one or more images; and/or perform other operations. Communication may be wireless, for example, as described below (in conjunction with FIG. 11).

In some embodiments, the one or more processors are configured to facilitate semi-automated inspection. Facilitating semi-automated inspection comprises causing real time or near real time display of the one or more images to a user with a user interface (e.g., see 1112-1116 described below related to FIG. 11). Facilitating semi-automated inspection also includes receiving entry and/or selection of control commands from the user via the user interface. These control commands may be received in real time or near real time as the one or more images are displayed to the user. In some embodiments, the control commands comprise live adjustments, for example.

The control commands may comprise instructions for moving body 402 and one or more image capture devices 404 based on a region on interest of the portion of the lithography apparatus (e.g., 300 shown in FIG. 3A, 3B). The region of interest of the portion of the lithography apparatus may be a certain area of a membrane, for example, that appears contaminated in an image, or is typically contaminated (e.g., as determined based on prior inspections), and/or other regions of interest. The control commands may comprise instructions for adjustment of a focus, zoom, or other characteristics of one or more image capture devices 404. For example, an image capture device 404 may have an electronically controllable focus setting, zoom setting, etc. The control commands may comprise instructions for adjustment of illumination from one or more light sources 406 associated with one or more image capture devices 404. For example, a light source 406 may have an electronically controllable brightness, wavelength (color), and/or other characteristics. As another example, an image capture device 404 may have an electronically controllable contrast setting. The control commands may comprise instructions for obtaining updated images using an adjusted zoom, focus, and/or illumination, for example, and/or other control commands. Facilitating semi-automated inspection comprises causing display of the updated images to the user with the user interface so that the user can determine presence of contamination in the region of interest (e.g., on a membrane or a specific portion of a membrane) based on the updated images.

In some embodiments, the one or more images may be electronically stitched (e.g., in real time, near real time, and/or at other times). The stitching may be performed by a user via the user interface, automatically by the one or more processors, and/or in other ways. The stitch may be configured such that stitched images comprise a view of the entirety (or near entirety) of a membrane surface over a distance that one or more images capture devices 404 travel across a membrane. In some embodiments, the images from individual image capture devices 404 may be electronically stitched such that the stitched images comprise a view of one or more target portions of a membrane (e.g., something less than the entirety of a membrane).

Figure 5:
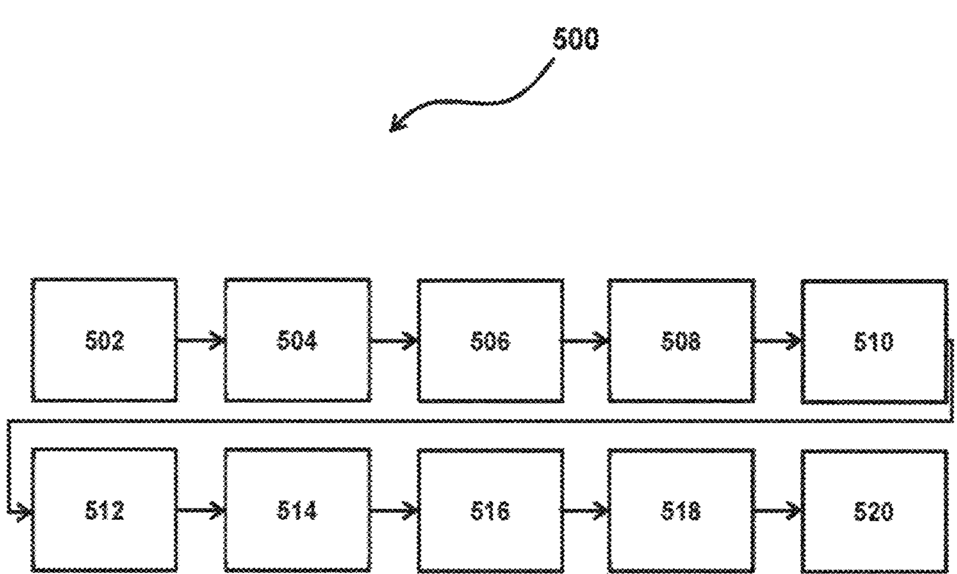
FIG. 5 illustrates an inspection flow, according to an embodiment.

By way of a non-limiting example, FIG. 5 illustrates one possible example of a semi-automated inspection flow 500. Flow 500 includes placing 502 inspection system 302 (FIG. 4) in a loading port (insertion point 318 shown in FIG. 3A) of lithography apparatus 300 (FIG. 3A, 3B), where the tool handler (e.g., 306, 307, 308 shown in FIG. 3A) picks up 504 system 302, transfers 506 system 302, and lowers 508 inspection system 302 into position for membrane inspection. The one or more processors (see FIG. 11) facilitate 510 user control (by controlling the tool handler) of a height and/or other position of body 402 relative to a membrane. The one or more processors provide 512 a remote live stream of images of the membrane and stitch 514 two or more of the images together for viewing by the user. The one or more processors facilitate 516 user control (by controlling image capture devices 404 and/or light sources 406) of zoom, focus, brightness, and/or other image set points; and image recordation 518. Once imaging is complete, inspection system 302 is returned 520 to the loading port for removal from lithography apparatus 300.

Returning to FIG. 4, in some embodiments, the one or more processors are configured to facilitate automated inspection. Automated inspection may be performed in real time or near real time as the one or more images are obtained. Automated inspection may also comprise live adjustments, for example. Facilitating automated inspection comprises automatically determining the region of interest of the portion of the lithography apparatus based on the one or more images. The region of interest of the portion of the lithography apparatus may be a certain predetermined area of a membrane, for example, that appears contaminated in an image, or is typically contaminated (e.g., as determined based on prior inspections), and/or other regions of interest. Facilitating automated inspection comprises controlling the tool handler (FIG. 3A) to move body 402 and one or more image capture devices 404 based on the region on interest and/or other information. Facilitating automated inspection comprises adjusting a zoom and/or focus of one or more image capture devices 404 based on the one or more images and/or other information; and adjusting illumination from one or more light sources 406 associated with one or more image capture devices 404 based on the one or more images and/or other information. Facilitating automated inspection comprises causing one or more image capture devices 404 to obtain updated images using an adjusted focus and/or illumination; determining presence of contamination in the region of interest based on the updated images; and/or other operations.

In some embodiments, the one or more processors are configured to facilitate the automated (or semi-automated) inspection based on a trained machine learning algorithm. The trained machine learning algorithm is configured to receive the one or more images and/or other information as input, and output corresponding control commands. The corresponding control commands are related to determining the region of interest, controlling the tool handler (FIG. 3A) to move body 402 and one or more image capture devices 404, adjusting the zoom and/or focus, adjusting the illumination, causing one or more image capture devices 404 to obtain the updated images, determining the presence of contamination, and/or other commands. The trained machine learning algorithm is trained based on previously obtained images of the portion of the lithography apparatus (e.g., lithography apparatus 300 shown in FIGS. 3A and 3B) with and without contamination, and/or other information. The previously obtained images are labelled with a region of interest, a body and/or imaging device location relative to the region of interest, an imaging device zoom and/or focus, an illumination level, an indication of whether contamination is present, and/or other labels. Lithography apparatus performance is related to contamination identified in an image, and correlation of lithography apparatus performance data and image inspection data is used to label the images and/or otherwise configure the machine learning algorithm, for example.

In some embodiments, the machine learning algorithm may be and/or include mathematical equations, algorithms, plots, charts, networks (e.g., neural networks), and/or other tools and machine learning components. For example, the machine learning algorithms may be and/or include one or more neural networks having an input layer, an output layer, and one or more intermediate or hidden layers. In some embodiments, the one or more neural networks may be and/or include deep neural networks (e.g., neural networks that have one or more intermediate or hidden layers between the input and output layers).

As an example, the one or more neural networks may be based on a large collection of neural units (or artificial neurons). The one or more neural networks may loosely mimic the manner in which a biological brain works (e.g., via large clusters of biological neurons connected by axons). Each neural unit of a neural network may be connected with many other neural units of the neural network. Such connections can be enforcing or inhibitory in their effect on the activation state of connected neural units. In some embodiments, each individual neural unit may have a summation function that combines the values of all its inputs together. In some embodiments, each connection (or the neural unit itself) may have a threshold function such that a signal must surpass the threshold before it is allowed to propagate to other neural units. These neural network systems may be self-learning and trained, rather than explicitly programmed, and can perform significantly better in certain areas of problem solving, as compared to traditional computer programs. In some embodiments, the one or more neural networks may include multiple layers (e.g., where a signal path traverses from front layers to back layers). In some embodiments, back propagation techniques may be utilized by the neural networks, where forward stimulation is used to reset weights on the "front" neural units. In some embodiments, stimulation and inhibition for the one or more neural networks may be freer flowing, with connections interacting in a more chaotic and complex fashion. In some embodiments, the intermediate layers of the one or more neural networks include one or more convolutional layers, one or more recurrent layers, and/or other layers.

The one or more neural networks may be trained (i.e., whose parameters are determined) using a set of training information. The training information may include a set of training samples. Each sample may be a pair comprising an input object (typically a vector, which may be called a feature vector) and a desired output value (also called the supervisory signal). Here this may include a labelled input image (with or without contamination) and a corresponding control command. A training algorithm analyzes the training information and adjusts the behavior of the neural network by adjusting the parameters (e.g., weights of one or more layers) of the neural network based on the training information. For example, given a set of N training samples of the form $\{(x_1, y_1), (x_2, y_2), \ldots, (x_N, y_N)\}$ such that $x_i$ is the feature vector of the i-th example and $y_i$ is its supervisory signal, a training algorithm seeks a neural network $g: X \rightarrow Y$, where X is the input space and Y is the output space. A feature vector is an n-dimensional vector of numerical features that represent some object (e.g., a simulated aerial image, a wafer design, a clip, etc.). The vector space associated with these vectors is often called the feature space. After training, the neural network may be used for making predictions using new samples.

In some embodiments, the trained machine learning algorithm comprises a neural network having an input layer, an output layer, and one or more hidden layers. In some embodiments, the trained machine learning algorithm comprises a convolutional neural network. The convolutional neural network is an artificial neural network that features one or more convolutional layers. Convolution layers extract features from an input image. Convolution preserves the relationship between pixels by learning image features using small squares of input data. An input layer may proceed to convolution blocks before being output to convolutional output block.

In some embodiments, the trained machine learning algorithm may implement an inverted residual structure where the input and output of a residual block are thin bottleneck layers. A residual layer may feed into the next layer and directly into layers that are one or more layers downstream. A bottleneck layer is a layer that contains few neural units compared to the previous layers. The trained machine learning algorithm may use a bottleneck layer to obtain a representation of an input image with reduced dimensionality. An example of this is the use of autoencoders with bottleneck layers for nonlinear dimensionality reduction. Additionally, the machine learning algorithm may remove non-linearities in a narrow layer in order to maintain representational power. In some embodiments, the design of the machine learning algorithm may also be guided by the metric of computation complexity (e.g., the number of floating point operations). In some embodiments, the machine learning algorithm may increase the feature map dimension at all units to involve as many locations as possible instead of sharply increasing the feature map dimensions at neural units that perform downsampling. In some embodiments, the machine learning algorithm may decrease the depth and increase width of residual layers in the downstream direction.

Figure 6:
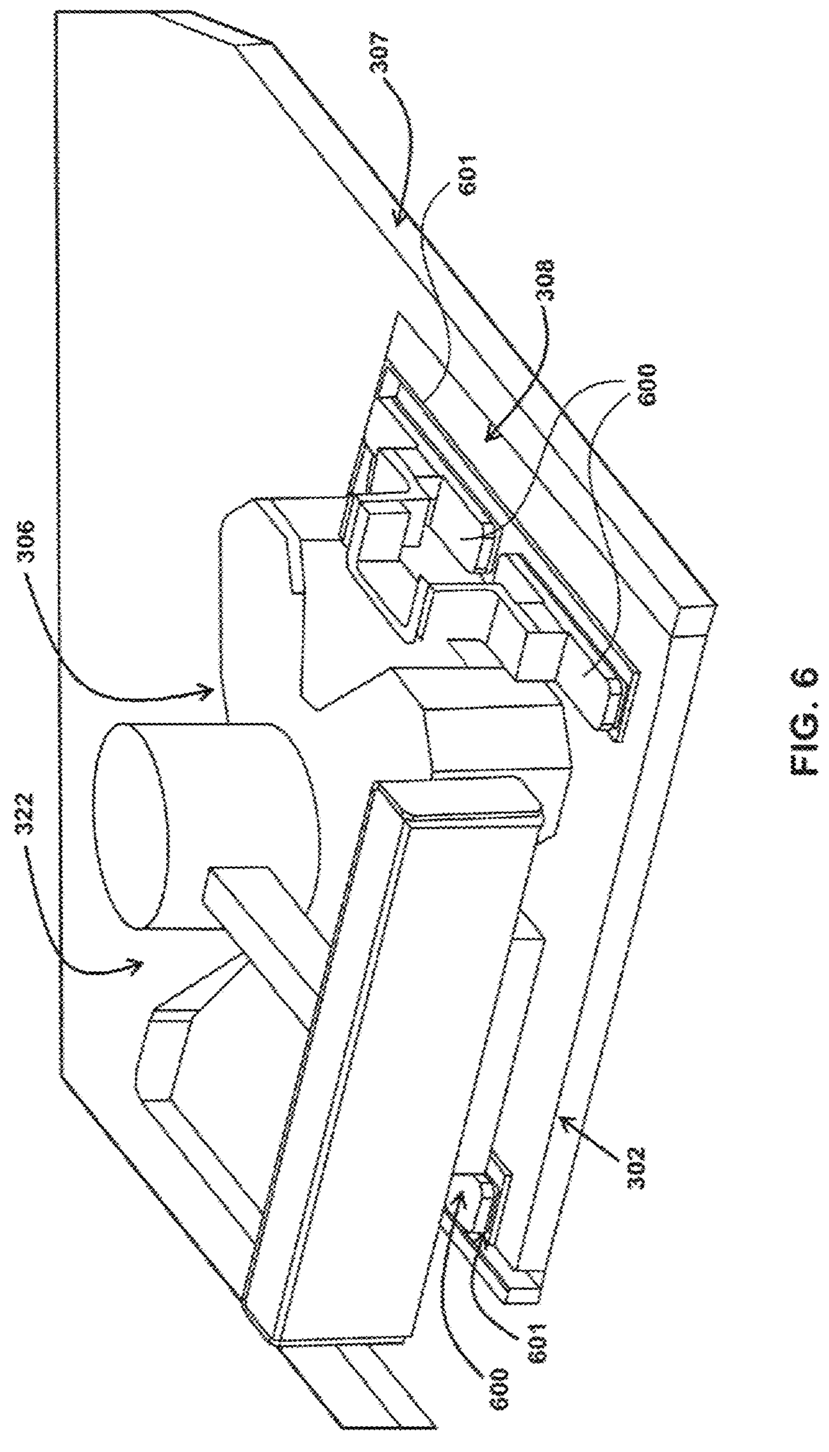
FIG. 6 illustrates a reticle handler turret gripper gripping the inspection system, according to an embodiment.
Figure 7:
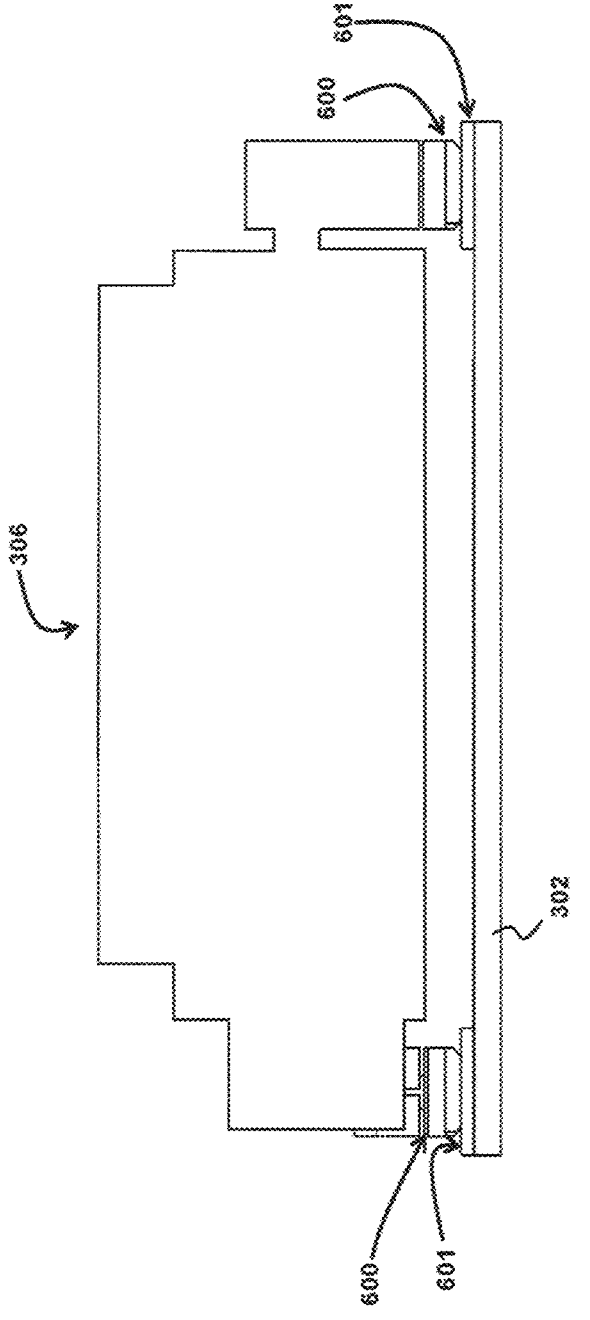
FIG. 7 illustrates a side view of feet of the reticle handler turret gripper gripping the inspection system, according to an embodiment.

FIG. 6-9 provide further illustrations of inspection system 302 in conjunction with lithographic apparatus 300. FIG. 6 illustrates reticle handler turret gripper 306 and gripping inspection system 302. Engagement surfaces 601 are configured to grip inspection system 302 in a position and orientation that corresponds to gripping feet 600 of gripper 306. In this example, surfaces 601 remain at a fixed distance from each other that corresponds to a distance between feet 600. Surfaces 601 also remain perpendicular to feet 600 to facilitate gripping by feet 600. FIG. 7 illustrates a side view of feet 600 of reticle handler turret gripper 306 gripping inspection system 302.

Figure 8:
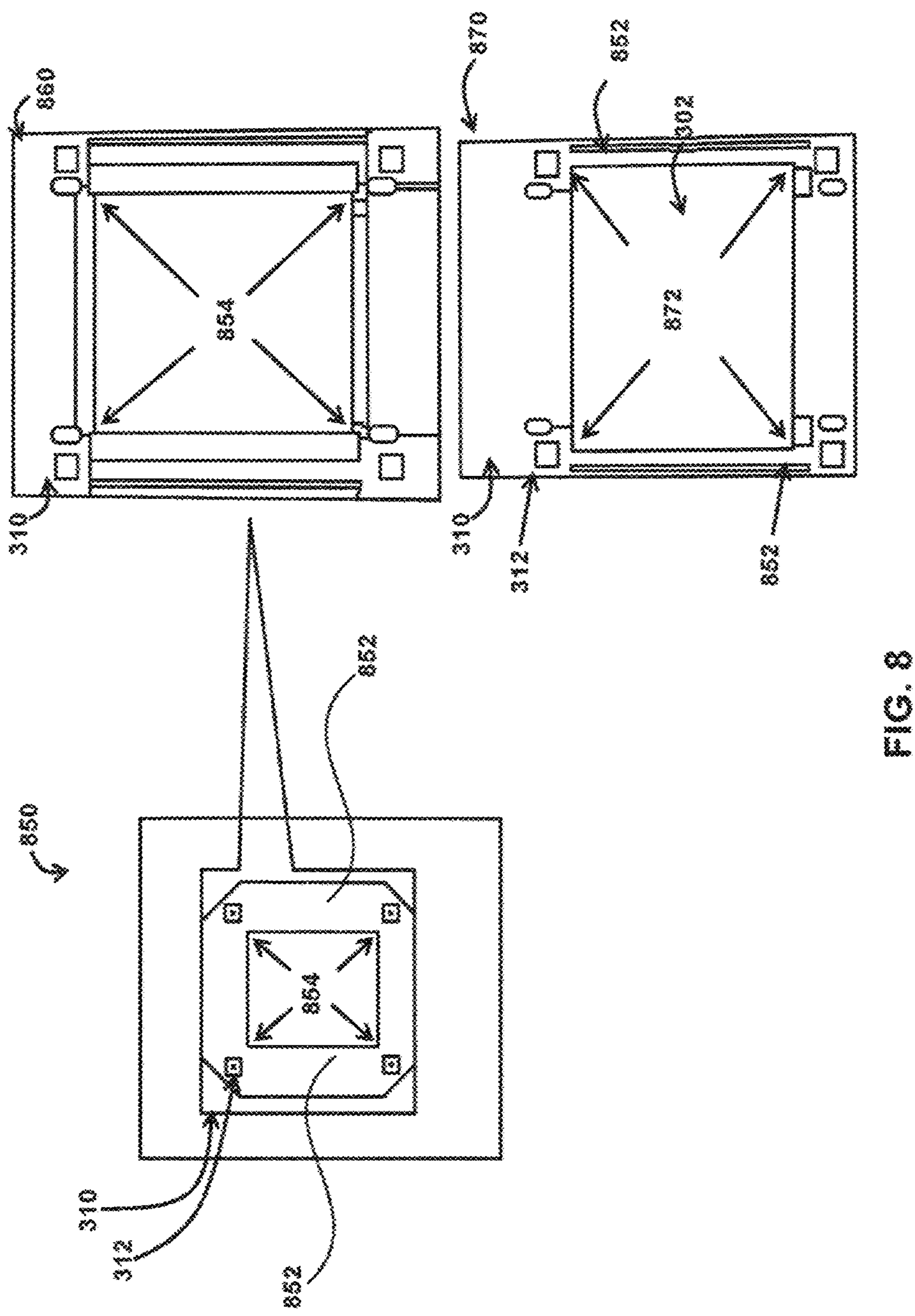
FIG. 8 illustrates overhead views of a reticle stage, reticle clamps, and/or associated membranes, according to an embodiment.

FIG. 8 illustrates overhead views 850, 860, and 870 of reticle stage 310, reticle clamps 312, and associated membranes 852. In some embodiments, membranes 852 may be the target surfaces inspected by inspection system 302, for example. Typically, membranes 852 are in contact with the bottom of a reticle, in the areas where a barcode (and/or other identification data) is printed. The printing is applied with chrome, MoSi, or other materials. When the reticle is clamped via vacuum and then scanned (e.g., for identification purposes), the high contact pressure can initiate molecular level bonding between the reticle material and the clamp 312 and/or membrane 852 material. When separated, small portions of the reticle material are pulled out and remain on the surface of the membrane 852. Hence the need for inspection. In practice, reticle handler turret gripper 306 (not shown in FIG. 8) would lower (e.g., into the page) inspection system 302 (e.g., reticle sized) in proximity to clamps 312 and/or associated membranes 852. View 860 is an enlarged view of a portion of view 850. Views 850 and 860 show the size 854 of a typical reticle held by clamps 312. View 870 shows the approximate size 872 of an area that inspection system 302 may be used to inspect (e.g., by moving inspection system 302 around as described above). Size 872 is large enough to include membranes 852 for inspection.

Figure 9:
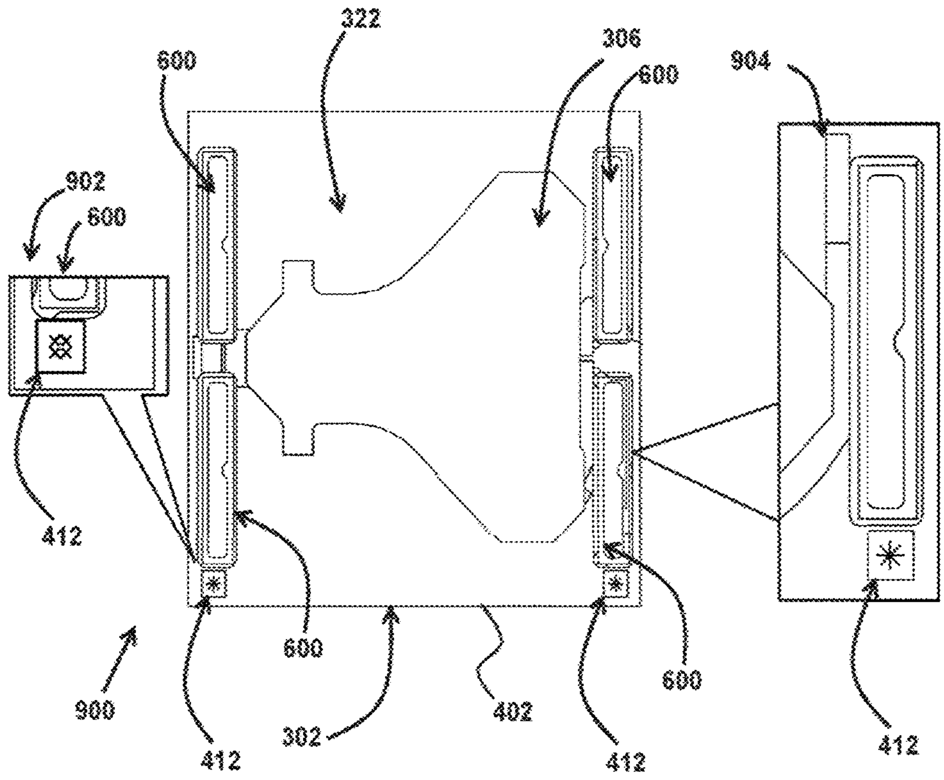
FIG. 9 shows a view of the turret gripper and feet of the turret gripper looking (up) through the inspection system, according to an embodiment.

FIG. 9 shows a view 900 of turret gripper 306 and feet 600 looking (up) through inspection system 302 (e.g., if body 402 were formed from a transparent material). FIG. 9 also shows enlarged views 902 and 904 of feet 600 positioned relative to identification features 412 (as an example). In some embodiments, feet 600 of turret gripper 306 may couple with a continuous surface of body 402 to seal against when pulling a vacuum to lift and/or otherwise move inspection system 302 (e.g., which is reticle shaped).

Figure 10:
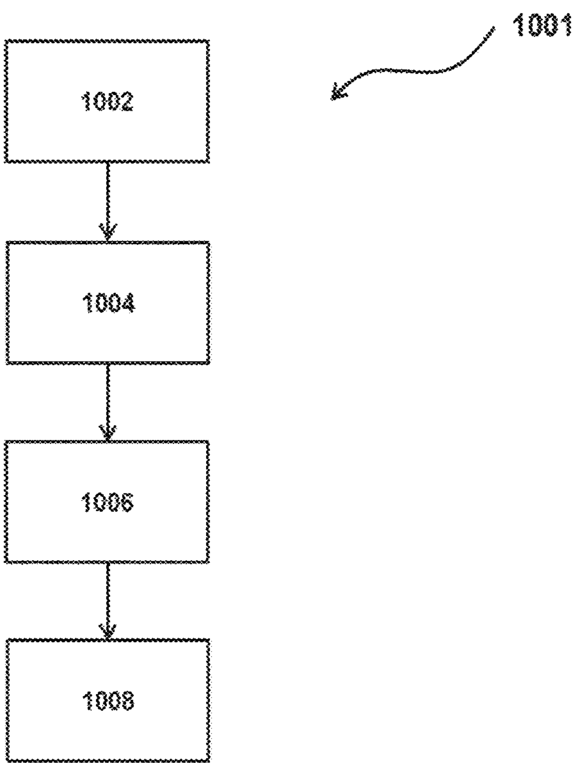
FIG. 10 illustrates a method for inspecting a portion of a lithography apparatus, according to an embodiment.

FIG. 10 illustrates a method 1001 for inspecting a portion of a lithography apparatus. Method 1001 may be performed with an inspection system, for example. In some embodiments, the inspection system comprises a body, one or more image capture devices, one or more light sources, electronics, a power source, one or more identification features, and/or other components. In some embodiments, the inspection system includes and/or is configured to communicate with one or more processors and/or a computing system, as described below (see FIG. 11). The operations of method 1001 presented below are intended to be illustrative. In some embodiments, method 1001 may be accomplished with one or more additional operations not described, and/or without one or more of the operations discussed. Additionally, the order in which the operations of method 1001 are illustrated in FIG. 10 and described below is not intended to be limiting.

In some embodiments, one or more portions of method 1001 may be implemented in and/or controlled by one or more processing devices (e.g., a digital processor, an analog processor, a digital circuit designed to process information, an analog circuit designed to process information, a state machine, and/or other mechanisms for electronically processing information, as described with respect to FIG. 11 below). The one or more processing devices may include one or more devices executing some or all of the operations of method 1001 in response to instructions stored electronically on an electronic storage medium. The one or more processing devices may include one or more devices configured through hardware, firmware, and/or software to be specifically designed for execution of one or more of the operations of method 1001 (e.g., see discussion related to FIG. 11 below). For example, the one or more processing devices may run (e.g., ASML Twinscan) software configured to run an inspection program that causes one or more of the operations described herein to be performed.

At an operation 1002, the inspection system is inserted into and received by the lithography apparatus. In some embodiments, the lithography apparatus is configured for DUV or EUV radiation. In some embodiments, the inspection system comprises a reticle sized and shaped body. The body is shaped similar to or the same as a reticle that is typically engaged and positioned by the tool handler. In some embodiments, the body comprises one or more identification features. In some embodiments, the one or more identification features comprise one or more of a label, a bar code, and an alignment mark. In some embodiments, operation 1002 is performed by a tool handler of the lithography apparatus (e.g., reticle handler robot gripper 307 shown in FIGS. 3A and 3B and described herein) and/or other components.

In some embodiments, operation 1002 comprises engaging and moving the inspection system with a second portion of the tool handler of the lithography apparatus to a position at or near one or more membranes of the lithography apparatus for inspection. The one or more membranes may be or include a chuck membrane associated with reticle stage reticle clamps, for example. In some embodiments, the second portion of the tool handler may be a reticle handler turret gripper and/or other components. The turret gripper is configured to grip the body on one of more surfaces and/or edges of the body and move the body to a position adjacent a membrane of the lithography apparatus, and adjust the position of the body (e.g., to obtain clear images). In some embodiments, the reticle handler turret gripper is the same as or similar to turret gripper 306 (shown in FIGS. 3A and 3B and described herein).

At an operation 1004, the one or more membranes are illuminated. Operation 1004 comprises illuminating, with one or more light sources associated with the one or more image capture devices and coupled to the body, a membrane of the lithography apparatus imaged by the one or more capture devices. In some embodiments, the one or more light sources comprise one or more light emitting diodes (LEDs). In some embodiments, operation 1004 is performed by the one or more light sources described above (e.g., light sources 406 shown in FIG. 4 and described herein).

At operation 1006, the inspection system is used to obtain images of the one or more membranes. Operation 1006 includes obtaining the one or more images of the portion of the lithography apparatus with one or more image capture devices coupled to the body. The one or more image capture devices are configured to obtain one or more images of the portion of the lithography apparatus when the body is positioned by the tool handler. In some embodiments, the one or more image capture devices comprise one or more optical cameras. In some embodiments, operation 1006 is performed by the one or more image capture devices described above (e.g., image capture devices 404 shown in FIG. 4 and described herein). In some embodiments, operation 1006 comprises receiving and storing, with electronics coupled to the body (e.g., electronics 408 shown in FIG. 4), the one or more images from the one or more image capture devices; and/or wirelessly communicating, with the electronics, information to or from the one or more image capture devices. In some embodiments, the one or more image capture devices, the one or more light sources, and/or associated electronics are powered with a power source coupled to the body (e.g., power source 410 shown in FIG. 4).

At operation 1008, the inspection is performed based on the images and/or other information. In some embodiments, operation 1008 is performed by the one or more processors described herein (e.g., processors 1104, 1105, etc., shown in FIG. 11), electronics 408 shown in FIG. 4, and/or other components. Operation 1008 comprises receiving the one or more images from the one or more image capture devices, and facilitating semi-automated or automated inspection of the membrane(s) of the lithography apparatus based on the one or more images.

In some embodiments, facilitating semi-automated inspection comprises: causing display of the one or more images to a user with a user interface, and receiving entry and/or selection of control commands from the user via the user interface. The control commands comprise: instructions for moving the body and the one or more image capture devices based on a region on interest of the membrane of the lithography apparatus; instructions for adjustment of a zoom and/or focus of the one or more image capture devices; instructions for adjustment of illumination from one or more light sources associated with the one or more image capture devices; and/or instructions for obtaining updated images using an adjusted zoom, focus, and/or illumination. In some embodiments, operation 1008 comprises causing display of the updated images to the user with the user interface so that the user can determine presence of contamination in the region of interest based on the updated images. In some embodiments, the display of the one or more images and/or the updated images to the user comprises a live stream.

In some embodiments, facilitating automated inspection comprises: determining a region of interest of a membrane of the lithography apparatus based on the one or more images; controlling the tool handler to move the body and the one or more image capture devices based on the region on interest; adjusting of a zoom and/or focus of the one or more image capture devices based on the one or more images; adjusting illumination from one or more light sources associated with the one or more image capture devices based on the one or more images; causing the one or more image capture device to obtain updated images using an adjusted zoom, focus, and/or illumination; determining presence of contamination in the region of interest based on the updated images; and/or other operations. In some embodiments, the one or more processors are configured to facilitate the automated inspection based on a trained machine learning algorithm.

In some embodiments, the trained machine learning algorithm comprises a neural network having an input layer, an output layer, and one or more hidden layers. The trained machine learning algorithm is configured to receive the one or more images as input, and output corresponding control commands. The corresponding control commands are related to determining the region of interest, controlling the tool handler to move the body and the one or more image capture devices, adjusting the zoom and/or focus, adjusting the illumination, causing the one or more image capture device to obtain the updated images, determining the presence of contamination, and/or other operations. The trained machine learning algorithm is trained based on previously obtained images of the portion of the lithography apparatus with and without contamination and/or other information. The previously obtained images may be labelled with a region of interest, a body and/or imaging device location relative to the region of interest, an imaging device focus, an illumination, an indication of whether contamination is present, and/or other information. Lithography apparatus performance is related to contamination identified in an image, and correlation of lithography apparatus performance data and image inspection data is also used to configure the machine learning algorithm.

FIG. 11 is a block diagram that illustrates a computer system 1100 that can assist in implementing the methods, flows, or the system(s) disclosed herein. Computer system 1100 includes a bus 1102 or other communication mechanism for communicating information, and a processor 1104 (or multiple processors 1104 and 1105) coupled with bus 1102 for processing information. Computer system 1100 also includes a main memory 1106, such as a random access memory (RAM) or other dynamic storage device, coupled to bus 1102 for storing information and instructions to be executed by processor 1104. Main memory 1106 also may be used for storing temporary variables or other intermediate information during execution of instructions to be executed by processor 1104. Computer system 1100 further includes a read only memory (ROM) 1108 or other static storage device coupled to bus 1102 for storing static information and instructions for processor 1104. A storage device 1110, such as a magnetic disk or optical disk, is provided and coupled to bus 1102 for storing information and instructions.

Computer system 1100 may be coupled via bus 1102 to a display 1112, such as a cathode ray tube (CRT) or flat panel or touch panel display for displaying information to a computer user. An input device 1114, including alphanumeric and other keys, is coupled to bus 1102 for communicating information and command selections to processor 1104. Another type of user input device is cursor control 1116, such as a mouse, a trackball, or cursor direction keys for communicating direction information and command selections to processor 1104 and for controlling cursor movement on display 1112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more flows and/or methods described herein may be performed by computer system 1100 in response to processor 1104 executing one or more sequences of one or more instructions contained in main memory 1106. Such instructions may be read into main memory 1106 from another computer-readable medium, such as storage device 1110. Execution of the sequences of instructions contained in main memory 1106 causes processor 1104 to perform the flows and/or process steps described herein. One or more processors in a multi-processing arrangement may also be employed to execute the sequences of instructions contained in main memory 1106. In an alternative embodiment, hard-wired circuitry may be used in place of or in combination with software instructions. Thus, the description herein is not limited to any specific combination of hardware circuitry and software.

The term "computer-readable medium" or "machine readable medium" as used herein refers to any medium that participates in providing instructions to processor 1104 for execution. Such a medium may take many forms, including but not limited to, non-volatile media, volatile media, and transmission media. Non-volatile media include, for example, optical or magnetic disks, such as storage device 1110. Volatile media include dynamic memory, such as main memory 1106. Transmission media include coaxial cables, copper wire and fiber optics, including the wires that comprise bus 1102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1104 for execution. For example, the instructions may initially be borne on a magnetic disk of a remote computer. The remote computer can load the instructions into its dynamic memory and send the instructions over a telephone line using a modem. A modem local to computer system 1100 can receive the data on the telephone line and use an infrared transmitter to convert the data to an infrared signal. An infrared detector coupled to bus 1102 can receive the data carried in the infrared signal and place the data on bus 1102. Bus 1102 carries the data to main memory 1106, from which processor 1104 retrieves and executes the instructions. The instructions received by main memory 1106 may optionally be stored on storage device 1110 either before or after execution by processor 1104.

Computer system 1100 may also include a communication interface 1118 coupled to bus 1102. Communication interface 1118 provides a two-way data communication coupling to a network link 1120 that is connected to a local network 1122. For example, communication interface 1118 may be an integrated services digital network (ISDN) card or a modem to provide a data communication connection to a corresponding type of telephone line. As another example, communication interface 1118 may be a local area network (LAN) card to provide a data communication connection to a compatible LAN. Wireless links may also be implemented. In any such implementation, communication interface 1118 sends and receives electrical, electromagnetic, or optical signals that carry digital data streams representing various types of information.

Network link 1120 typically provides data communication through one or more networks to other data devices. For example, network link 1120 may provide a connection through local network 1122 to a host computer 1124 or to data equipment operated by an Internet Service Provider (ISP) 1126. ISP 1126 in turn provides data communication services through the worldwide packet data communication network, now commonly referred to as the "Internet" 1128. Local network 1122 and Internet 1128 both use electrical, electromagnetic, or optical signals that carry digital data streams. The signals through the various networks and the signals on network link 1120 and through communication interface 1118, which carry the digital data to and from computer system 1100, are exemplary forms of carrier waves transporting the information.

Computer system 1100 can send messages and receive data, including program code, through the network(s), network link 1120, and communication interface 1118. In the Internet example, a server 1130 might transmit a requested code for an application program through Internet 1128, ISP 1126, local network 1122 and communication interface 1118. One such downloaded application may provide all or part of a method described herein, for example. The received code may be executed by processor 1104 as it is received, and/or stored in storage device 1110, or other non-volatile storage for later execution. In this manner, computer system 1100 may obtain application code in the form of a carrier wave.

Figure 12:
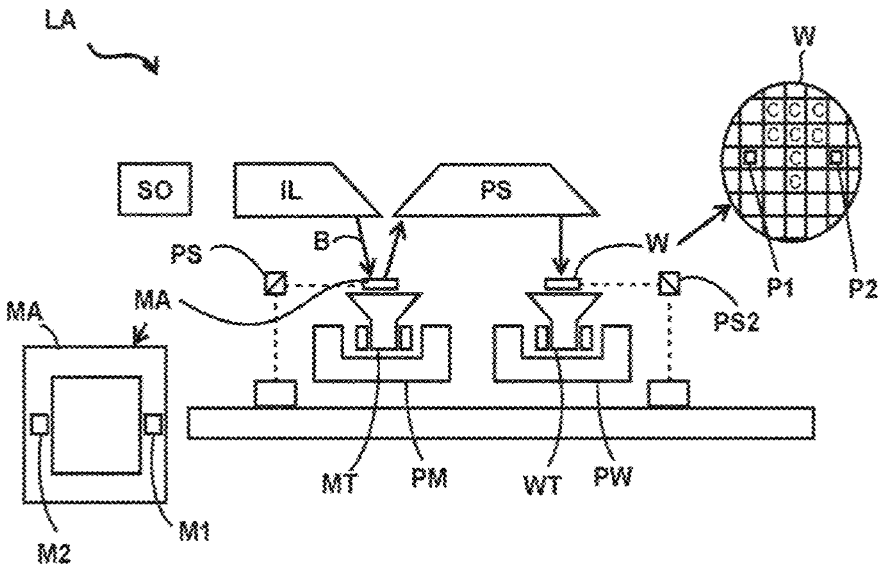
FIG. 12 is a schematic diagram of a lithographic projection apparatus similar to FIG. 1, according to an embodiment.

FIG. 12 schematically depicts an exemplary lithographic projection apparatus LA similar to and/or the same as the apparatus shown in FIG. 1, FIG. 3A, and/or FIG. 3B that can be used in conjunction with the techniques described herein. Apparatus LA may generally represent a DUV apparatus, for example, with a twin scan setup (this example is not intended to be limiting). The apparatus comprises an illumination system IL configured to condition a beam B of radiation. In this example, the illumination system also comprises a radiation source SO. The apparatus comprises a first object table (e.g., patterning device table) MT provided with a patterning device holder to hold a patterning device MA (e.g., a reticle). It is connected to a first positioner to accurately position the patterning device with respect to item PS. The apparatus comprises a second object table (substrate table) WT provided with a substrate holder to hold a substrate W (e.g., a resist-coated silicon wafer). It is connected to a second positioner to accurately position the substrate with respect to item PS. The apparatus comprises a projection system ("lens") PS (e.g., a refractive, catoptric or catadioptric optical system) to image an irradiated portion of the patterning device MA onto a target portion C (e.g., comprising one or more dies) of the substrate W.

As depicted, apparatus LA is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam B impinging on the patterning device MA has a desired uniformity and intensity distribution in its cross-section.

It should be noted with regard to FIG. 12 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means), the substrate table WT can be moved accurately, e.g. to position different target portions C in the path of the beam. Similarly, the first positioning means can be used to accurately position the patterning device MA with respect to the path of the beam B, e.g., after mechanical retrieval of the patterning device MA from a patterning device library, or during a scan. In general, movement of the object tables MT, WT is realized with the aid of a long-stroke module (coarse positioning) and a short-stroke module (fine positioning), which are not explicitly depicted. However, in the case of a stepper (as opposed to a step-and-scan tool) the patterning device table MT may just be connected to a short stroke actuator, or may be fixed.

As described above, LA can be used in two different modes. In step mode, the patterning device table MT is kept essentially stationary, and an entire patterning device image is projected in one operation (i.e., a single "flash") onto a target portion C. The substrate table WT is then shifted in the x and/or y directions so that a different target portion C can be irradiated by the beam. In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

Various embodiments of the present systems and methods are disclosed in the subsequent list of numbered clauses:

1. A system for inspecting a portion of a lithography apparatus, the system comprising: a body, the body configured to be inserted into the lithography apparatus, engaged by a tool handler of the lithography apparatus, and positioned by the tool handler for inspecting the portion of the lithography apparatus; and one or more image capture devices coupled to the body, the one or more image capture devices configured to obtain one or more images of the portion of the lithography apparatus when the body is positioned by the tool handler.
2. The system of clause 1, wherein the body is shaped similar to or the same as a reticle that is engaged and positioned by the tool handler.
3. The system of any of the previous clauses, wherein the portion of the lithography apparatus comprises one or more membrane surfaces of the lithography apparatus.
4. The system of any of the previous clauses, wherein the portion of the lithography apparatus comprises a chuck membrane associated with reticle stage reticle clamps.
5. The system of any of the previous clauses, wherein the body has a rectangular shape, wherein the tool handler comprises a reticle handler and a turret gripper, wherein the reticle handler is configured to move the body from a load port of the lithography apparatus to the turret gripper, and wherein the turret gripper is configured to grip the body on one of more edges of the body and move the body to a position adjacent the portion of the lithography apparatus, and adjust the position of the body.
6. The system of any of the previous clauses, wherein the one or more image capture devices comprise one or more optical cameras.
7. The system of any of the previous clauses, further comprising one or more light sources associated with the one or more image capture devices and coupled to the body, the one or more light sources configured to light the portion of the lithography apparatus imaged by the one or more capture devices.

8. The system of any of the previous clauses, wherein the one or more light sources comprise one or more light emitting diodes (LEDs).
9. The system of any of the previous clauses, further comprising electronics coupled to the body, the electronics configured to: receive and store the one or more images from the one or more image capture devices; and/or wirelessly communicate information to or from the one or more image capture devices.
10. The system of any of the previous clauses, further comprising a power source coupled to the body, the power source configured to power the one or more image capture devices, the one or more light sources, and/or associated electronics.
11. The system of any of the previous clauses, wherein the body comprises one or more identification features.
12. The system of any of the previous clauses, wherein the one or more identification features comprise one or more of a label, a bar code, and an alignment mark.
13. The system of any of the previous clauses, further comprising one or more processors, the one or more processors configured by machine-readable instructions to: receive the one or more images from the one or more image capture devices; facilitate semi-automated or automated inspection of the portion of the lithography apparatus based on the one or more images; and communicate data to one or more external computing devices.
14. The system of any of the previous clauses, wherein the one or more processors are configured to facilitate semi-automated inspection, and wherein facilitating semi-automated inspection comprises: causing display of the one or more images to a user with a user interface; receiving entry and/or selection of control commands from the user via the user interface, the control commands comprising: instructions for moving the body and the one or more image capture devices based on a region on interest of the portion of the lithography apparatus; instructions for adjustment of a focus of the one or more image capture devices; instructions for adjustment of illumination from one or more light sources associated with the one or more image capture devices; and/or instructions for obtaining updated images using an adjusted focus and/or illumination; and causing display of the updated images to the user with the user interface so that the user can determine presence of contamination in the region of interest based on the updated images.
15. The system of any of the previous clauses, wherein the display of the one or more images and/or the updated images to the user comprises a live stream.
16. The system of any of the previous clauses, wherein the one or more processors are configured to facilitate automated inspection, and wherein facilitating automated inspection comprises: determining a region of interest of the portion of the lithography apparatus based on the one or more images; controlling the tool handler to move the body and the one or more image capture devices based on the region on interest; adjusting of a focus of the one or more image capture devices based on the one or more images; adjusting illumination from one or more light sources associated with the one or more image capture devices based on the one or more images; causing the one or more image capture device to obtain updated images using an adjusted focus and/or illumination; and/or determining presence of contamination in the region of interest based on the updated images.
17. The system of any of the previous clauses, wherein the one or more processors are configured to facilitate the automated inspection based on a trained machine learning algorithm, the trained machine learning algorithm configured to receive the one or more images as input, and output corresponding control commands, the corresponding control commands related to determining the region of interest, controlling the tool handler to move the body and the one or more image capture devices, adjusting the focus, adjusting the illumination, causing the one or more image capture device to obtain the updated images, and/or determining the presence of contamination.
18. The system of any of the previous clauses, wherein the trained machine learning algorithm is trained based on previously obtained images of the portion of the lithography apparatus with and without contamination, the previously obtained images labelled with a region of interest, a body and/or imaging device location relative to the region of interest, an imaging device focus, an illumination, and/or an indication of whether contamination is present, wherein lithography apparatus performance is related to contamination identified in an image, and wherein correlation of lithography apparatus performance data and image inspection data is used to configure the machine learning algorithm.
19. The system of any of the previous clauses, wherein the trained machine learning algorithm comprises a neural network having an input layer, an output layer, and one or more hidden layers.
20. The system of any of the previous clauses, wherein the lithography apparatus is configured for deep ultra violet (DUV) radiation or extreme ultra violet (EUV) radiation.
21. A computer program product comprising a non-transitory computer readable medium having instructions recorded thereon, the instructions when executed by one or more processors of a computer causing operations comprising: receiving one or more images from one or more image capture devices included in an inspection system for inspecting a portion of a lithography apparatus, the system comprising: a body, the body configured to be inserted into the lithography apparatus, engaged by a tool handler of the lithography apparatus, and positioned by the tool handler for inspecting the portion of the lithography apparatus; and the one or more image capture devices, the one or more image capture devices coupled to the body, the one or more image capture devices configured to obtain one or more images of the portion of the lithography apparatus when the body is positioned by the tool handler; and facilitating inspection of the portion of the lithography apparatus based on the one or more images.
22. The medium of clause 21, wherein the one or more processors are configured to facilitate semi-automated inspection, and wherein facilitating semi-automated inspection comprises: causing display of the one or more images to a user with a user interface; receiving entry and/or selection of control commands from the user via the user interface, the control commands comprising: instructions for moving the body and the one or more image capture devices based on a region on interest of the portion of the lithography apparatus; instructions for adjustment of a focus of the one or more image capture devices; instructions for adjustment of illumination from one or more light sources associated with the one or more image capture devices; and/or instructions for obtaining updated images using an adjusted focus and/or illumination; and causing display of the updated images to the user with the user interface so that the user can determine presence of contamination in the region of interest based on the updated images.

23. The medium of any of the previous clauses, wherein the display of the one or more images and/or the updated images to the user comprises a live stream.

24. The medium of any of the previous clauses, wherein the one or more processors are configured to facilitate automated inspection, and wherein facilitating automated inspection comprises: determining a region of interest of the portion of the lithography apparatus based on the one or more images; controlling the tool handler to move the body and the one or more image capture devices based on the region on interest; adjusting of a focus of the one or more image capture devices based on the one or more images; adjusting illumination from one or more light sources associated with the one or more image capture devices based on the one or more images; causing the one or more image capture device to obtain updated images using an adjusted focus and/or illumination; and/or determining presence of contamination in the region of interest based on the updated images.

25. The medium of any of the previous clauses, wherein the one or more processors are configured to facilitate the automated inspection based on a trained machine learning algorithm, the trained machine learning algorithm configured to receive the one or more images as input, and output corresponding control commands, the corresponding control commands related to determining the region of interest, controlling the tool handler to move the body and the one or more image capture devices, adjusting the focus, adjusting the illumination, causing the one or more image capture device to obtain the updated images, and/or determining the presence of contamination.

26. The medium of any of the previous clauses, wherein the trained machine learning algorithm is trained based on previously obtained images of the portion of the lithography apparatus with and without contamination, the previously obtained images labelled with a region of interest, a body and/or imaging device location relative to the region of interest, an imaging device focus, an illumination, and/or an indication of whether contamination is present.

27. The medium of any of the previous clauses, wherein the body is shaped similar to or the same as a reticle that is engaged and positioned by the tool handler.

28. The medium of any of the previous clauses, wherein the portion of the lithography apparatus comprises one or more chuck membrane surfaces associated with reticle stage clamps of the lithography apparatus.

29. The medium of any of the previous clauses, wherein the tool handler comprises a reticle handler and a turret gripper, wherein the reticle handler is configured to move the body from a load port of the lithography apparatus to the turret gripper, and wherein the turret gripper is configured to move the body to a position adjacent the portion of the lithography apparatus, and adjust the position of the body.

30. The medium of any of the previous clauses, wherein the inspection system further comprises: one or more light sources associated with the one or more image capture devices and coupled to the body, the one or more light sources configured to light the portion of the lithography apparatus imaged by the one or more capture devices; electronics coupled to the body, the electronics configured to: receive and store the one or more images from the one or more image capture devices; and/or wirelessly communicate information to or from the one or more image capture devices; a power source coupled to the body, the power source configured to power the one or more image capture devices, the one or more light sources, and/or the electronics; and/or one or more identification features, wherein the one or more identification features comprise one or both of a bar code and an alignment mark.

31. A method for inspecting a portion of a lithography apparatus, the method comprising: receiving a body inserted into the lithography apparatus, the body configured to be engaged by a tool handler of the lithography apparatus, and positioned by the tool handler for inspecting the portion of the lithography apparatus; and obtaining one or more images of the portion of the lithography apparatus with one or more image capture devices coupled to the body, the one or more image capture devices configured to obtain one or more images of the portion of the lithography apparatus when the body is positioned by the tool handler.

32. The method of clause 31, wherein the body is shaped similar to or the same as a reticle that is engaged and positioned by the tool handler.

33. The method of any of the previous clauses, wherein the portion of the lithography apparatus comprises one or more membrane surfaces of the lithography apparatus.

34. The method of any of the previous clauses, wherein the portion of the lithography apparatus comprises a chuck membrane associated with reticle stage reticle clamps.

35. The method of any of the previous clauses, wherein the body has a rectangular shape, wherein the tool handler comprises a reticle handler and a turret gripper, wherein the reticle handler is configured to move the body from a load port of the lithography apparatus to the turret gripper, and wherein the turret gripper is configured to grip the body on one of more edges of the body and move the body to a position adjacent the portion of the lithography apparatus, and adjust the position of the body.

36. The method of any of the previous clauses, wherein the one or more image capture devices comprise one or more optical cameras.

37. The method of any of the previous clauses, further comprising illuminating, with one or more light sources associated with the one or more image capture devices and coupled to the body, the portion of the lithography apparatus imaged by the one or more capture devices.

38. The method of any of the previous clauses, wherein the one or more light sources comprise one or more light emitting diodes (LEDs).

39. The method of any of the previous clauses, further comprising: receiving and storing, with electronics coupled to the body, the one or more images from the one or more image capture devices; and/or wirelessly communicating, with the electronics, information to or from the one or more image capture devices.

40. The method of any of the previous clauses, further comprising powering, with a power source coupled to the body, the one or more image capture devices, the one or more light sources, and/or associated electronics.
41. The method of any of the previous clauses, wherein the body comprises one or more identification features.
42. The method of any of the previous clauses, wherein the one or more identification features comprise one or more of a label, a bar code, and an alignment mark.
43. The method of any of the previous clauses, further comprising: receiving, with one or more processors, the one or more images from the one or more image capture devices; facilitating, with the one or more processors, semi-automated or automated inspection of the portion of the lithography apparatus based on the one or more images; and communicating, with the one or more processors, data to one or more external computing devices.
44. The method of any of the previous clauses, wherein the one or more processors are configured to facilitate semi-automated inspection, and wherein facilitating semi-automated inspection comprises: causing display of the one or more images to a user with a user interface; receiving entry and/or selection of control commands from the user via the user interface, the control commands comprising: instructions for moving the body and the one or more image capture devices based on a region on interest of the portion of the lithography apparatus; instructions for adjustment of a focus of the one or more image capture devices; instructions for adjustment of illumination from one or more light sources associated with the one or more image capture devices; and/or instructions for obtaining updated images using an adjusted focus and/or illumination; and causing display of the updated images to the user with the user interface so that the user can determine presence of contamination in the region of interest based on the updated images.
45. The method of any of the previous clauses, wherein the display of the one or more images and/or the updated images to the user comprises a live stream.
46. The method of any of the previous clauses, wherein the one or more processors are configured to facilitate automated inspection, and wherein facilitating automated inspection comprises: determining a region of interest of the portion of the lithography apparatus based on the one or more images; controlling the tool handler to move the body and the one or more image capture devices based on the region on interest; adjusting of a focus of the one or more image capture devices based on the one or more images; adjusting illumination from one or more light sources associated with the one or more image capture devices based on the one or more images; causing the one or more image capture device to obtain updated images using an adjusted focus and/or illumination; and/or determining presence of contamination in the region of interest based on the updated images.
47. The method of any of the previous clauses, wherein the one or more processors are configured to facilitate the automated inspection based on a trained machine learning algorithm, the trained machine learning algorithm configured to receive the one or more images as input, and output corresponding control commands, the corresponding control commands related to determining the region of interest, controlling the tool handler to move the body and the one or more image capture devices, adjusting the focus, adjusting the illumination, causing the one or more image capture device to obtain the updated images, and/or determining the presence of contamination.
48. The method of any of the previous clauses, wherein the trained machine learning algorithm is trained based on previously obtained images of the portion of the lithography apparatus with and without contamination, the previously obtained images labelled with a region of interest, a body and/or imaging device location relative to the region of interest, an imaging device focus, an illumination, and/or an indication of whether contamination is present, wherein lithography apparatus performance is related to contamination identified in an image, and wherein correlation of lithography apparatus performance data and image inspection data is used to configure the machine learning algorithm.
49. The method of any of the previous clauses, wherein the trained machine learning algorithm comprises a neural network having an input layer, an output layer, and one or more hidden layers.
50. The method of any of the previous clauses, wherein the lithography apparatus is configured for deep ultra violet (DUV) radiation or extreme ultra violet (EUV) radiation.

The concepts disclosed herein may be associated with any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for wafer manufacturing on a substrate such as a silicon wafer, it shall be understood that the disclosed concepts may be used with any type of manufacturing system, e.g., those used for manufacturing on substrates other than silicon wafers. In addition, the combination and sub-combinations of disclosed elements may comprise separate embodiments. For example, the inspection system, and the associated software may comprise separate embodiments, and/or these features may be used together in the same embodiment.

The descriptions above are intended to be illustrative, not limiting. Thus, it will be apparent to one skilled in the art that modifications may be made as described without departing from the scope of the claims set out below.

What is claimed is:

1. A system for inspecting a portion of a lithography apparatus, the system comprising:
- a body, the body configured to be inserted into the lithography apparatus, to be engaged by a tool handler of the lithography apparatus, and to be positioned by the tool handler for inspecting the portion of the lithography apparatus; and
- one or more image capture devices coupled to the body, the one or more image capture devices configured to obtain one or more images of the portion of the lithography apparatus in response to the tool handler positioning the body.

2. The system of claim 1, wherein:
the lithography apparatus is configured for deep ultra violet (DUV) radiation or extreme ultra violet (EUV) radiation;
the body is shaped similar to, or the same as, a reticle that is engaged and positioned by the tool handler; and
the portion of the lithography apparatus comprises one or more membrane surfaces of the lithography apparatus.

3. The system of claim 1, wherein:
the body has a rectangular shape;
the tool handler comprises a reticle handler and a turret gripper;
the reticle handler is configured to move the body from a load port of the lithography apparatus to the turret gripper; and
the turret gripper is configured to grip the body on one of more edges of the body and move the body to a position adjacent the portion of the lithography apparatus, and adjust the position of the body.

4. The system of claim 1, further comprising:
one or more light sources associated with the one or more image capture devices and coupled to the body, the one or more light sources configured to light the portion of the lithography apparatus imaged by the one or more capture devices;
electronics coupled to the body, the electronics configured to:
receive and store the one or more images from the one or more image capture devices; and/or
wirelessly communicate information to, or from, the one or more image capture devices,
wherein the one or more light sources comprise one or more light emitting diodes (LEDs).

5. The system of claim 1, further comprising one or more processors, the one or more processors configured by machine-readable instructions to:
receive the one or more images from the one or more image capture devices;
facilitate semi-automated or automated inspection of the portion of the lithography apparatus based on the one or more images; and
communicate data to one or more external computing devices.

6. The system of claim 5, wherein the one or more processors are configured to facilitate semiautomated inspection, which comprises:
display of the one or more images to a user with a user interface, wherein the display of the one or more images to the user comprises a live stream;
receive entry and/or selection of one or more control commands from the user via the user interface, the one or more control commands comprising:
instructions for moving the body and the one or more image capture devices based on a region of interest of the portion of the lithography apparatus;
instructions for adjustment of a focus of the one or more image capture devices;
instructions for adjustment of illumination from one or more light sources associated with the one or more image capture devices; and/or
instructions for obtaining updated images using an adjusted focus and/or illumination; and
display of updated images to the user with the user interface so that the user can determine presence of contamination in the region of interest based on the updated images.

7. The system of claim 5, wherein the one or more processors are configured to facilitate automated inspection, which comprises:
determination of a region of interest of the portion of the lithography apparatus based on the one or more images;
control of the tool handler to move the body and the one or more image capture devices based on a region of interest;
adjustment of a focus of the one or more image capture devices based on the one or more images;
adjustment of illumination from one or more light sources associated with the one or more image capture devices based on the one or more images;
causation of the one or more image capture devices to obtain updated images using an adjusted focus and/or illumination; and/or
determination of presence of contamination in a region of interest based on updated images.

8. The system of claim 7, wherein:
the one or more processors are configured to facilitate the automated inspection based on a trained machine learning algorithm, the trained machine learning algorithm configured to receive the one or more images as input, and output one or more corresponding control commands, the one or more corresponding control commands related to determination of the region of interest, control of the tool handler to move the body and the one or more image capture devices, adjustment of the focus, adjustment of the illumination, causation of the one or more image capture device to obtain the updated images, and/or determination of the presence of contamination; and
the trained machine learning algorithm comprises a neural network having an input layer, an output layer, and one or more hidden layers.

9. The system of claim 8, wherein the trained machine learning algorithm is trained based on previously obtained images of the portion of the lithography apparatus with and without contamination, the previously obtained images labelled with a region of interest, a body and/or imaging device location relative to the region of interest, an imaging device focus, an illumination, and/or an indication of whether contamination is present, wherein lithography apparatus performance is related to contamination identified in an image, and wherein correlation of lithography apparatus performance data and image inspection data is used to configure the machine learning algorithm.

10. A computer program product comprising a non-transitory computer readable medium having instructions recorded thereon, the instructions, when executed by one or more processors, are configured to cause the one or more processors to at least:
receive one or more images from one or more image capture devices included in an inspection system for inspecting a portion of a lithography apparatus, the inspection system comprising:
a body, the body configured to be inserted into the lithography apparatus, to be engaged by a tool handler of the lithography apparatus, and to be positioned by the tool handler for inspecting the portion of the lithography apparatus; and
the one or more image capture devices, the one or more image capture devices coupled to the body, the one or more image capture devices configured to obtain the one or more images of the portion of the lithography apparatus in response to the tool handler positioning the body.

11. The medium of claim 10, wherein the one or more processors are configured to facilitate semi-automated inspection, which comprises:

display of the one or more images to a user with a user interface, wherein the display of the one or more images to the user comprises a live stream;

receive entry and/or selection of one or more control commands from the user via the user interface, the one or more control commands comprising:

instructions for moving the body and the one or more image capture devices based on a region of interest of the portion of the lithography apparatus;

instructions for adjustment of a focus of the one or more image capture devices;

instructions for adjustment of illumination from one or more light sources associated with the one or more image capture devices; and/or instructions for obtaining updated images using an adjusted focus and/or illumination; and display of updated images to the user with the user interface so that the user can determine presence of contamination in the region of interest based on the updated images.

12. The medium of claim 10, wherein the one or more processors are configured to facilitate automated inspection, which comprises:

determination of a region of interest of the portion of the lithography apparatus based on the one or more images;

control of the tool handler to move the body and the one or more image capture devices based on a region of interest;

adjustment of a focus of the one or more image capture devices based on the one or more images;

adjustment of illumination from one or more light sources associated with the one or more image capture devices based on the one or more images;

causation of the one or more image capture devices to obtain updated images using an adjusted focus and/or illumination; and/or determination of presence of contamination in a region of interest based on updated images.

13. The medium of claim 12, wherein the one or more processors are configured to facilitate the automated inspection based on a trained machine learning algorithm, the trained machine learning algorithm configured to receive the one or more images as input, and output one or more corresponding control commands, the one or more corresponding control commands related to determination of the region of interest, control of the tool handler to move the body and the one or more image capture devices, adjustment of the focus, adjustment of the illumination, causation of the one or more image capture device to obtain the updated images, and/or determination of the presence of contamination.

14. The medium of claim 13, wherein the trained machine learning algorithm is trained based on previously obtained images of the portion of the lithography apparatus with and without contamination, the previously obtained images labelled with a region of interest, a body and/or imaging device location relative to the region of interest, an imaging device focus, an illumination, and/or an indication of whether contamination is present.

15. A method for inspecting a portion of a lithography apparatus, the method comprising:

receiving a body inserted into the lithography apparatus, the body configured to be engaged by a tool handler of the lithography apparatus, and to be positioned by the tool handler for inspecting the portion of the lithography apparatus; and obtaining one or more images of the portion of the lithography apparatus with one or more image capture devices coupled to the body, the one or more image capture devices configured to obtain one or more images of the portion of the lithography apparatus in response to the tool handler positioning the body.

16. The method of claim 15, wherein:

the lithography apparatus is configured for deep ultra violet (DUV) radiation or extreme ultra violet (EUV) radiation;

the body is shaped similar to, or the same as, a reticle that is engaged and positioned by the tool handler; and the portion of the lithography apparatus comprises one or more membrane surfaces of the lithography apparatus.

17. The method of claim 15, wherein the tool handler comprises a reticle handler and a turret gripper and further comprising:

moving the body from a load port of the lithography apparatus to the turret gripper using the reticle handler; and by the turret gripper, gripping the body on one of more edges of the body and moving the body to a position adjacent the portion of the lithography apparatus.

18. The method of claim 15, further comprising:

receiving the one or more images from the one or more image capture devices;

facilitating semi-automated or automated inspection of the portion of the lithography apparatus based on the one or more images; and communicating data to one or more external computing devices.

19. The method of claim 18, wherein facilitating semi-automated inspection comprises:

causing display of the one or more images to a user with a user interface, wherein the display of the one or more images to the user comprises a live stream;

receiving entry and/or selection of one or more control commands from the user via the user interface, the one or more control commands comprising:

instructions for moving the body and the one or more image capture devices based on a region of interest of the portion of the lithography apparatus;

instructions for adjustment of a focus of the one or more image capture devices;

instructions for adjustment of illumination from one or more light sources associated with the one or more image capture devices; and/or instructions for obtaining updated images using an adjusted focus and/or illumination; and causing display of updated images to the user with the user interface so that the user can determine presence of contamination in the region of interest based on the updated images.

20. The method of claim 18, wherein facilitating automated inspection comprises:

determining a region of interest of the portion of the lithography apparatus based on the one or more images;

controlling the tool handler to move the body and the one or more image capture devices based on a region of interest;

adjusting of a focus of the one or more image capture devices based on the one or more images;

gadjusting illumination from one or more light sources associated with the one or more image capture devices based on the one or more images;

causing the one or more image capture devices to obtain updated images using an adjusted focus and/or illumination; and/or determining presence of contamination in a region of interest based on updated images.

* * * * *